US008841848B2

(12) United States Patent
Ogata et al.

(10) Patent No.: US 8,841,848 B2
(45) Date of Patent: Sep. 23, 2014

(54) METHOD OF CONTROLLING ILLUMINATION APPARATUS

(71) Applicant: Mitsubishi Chemical Corporation, Chiyoda-ku (JP)

(72) Inventors: Tomoyuki Ogata, Kanagawa (JP); Mitsuru Tanamura, Tokyo (JP); Hiroshi Ito, Tokyo (JP)

(73) Assignee: Mitsubishi Chemical Corporation, Chiyoda-ku (JP)

( * ) Notice: Subject to any disclaimer, the term of this patent is extended or adjusted under 35 U.S.C. 154(b) by 0 days.

(21) Appl. No.: 13/781,831

(22) Filed: Mar. 1, 2013

(65) Prior Publication Data

US 2013/0175948 A1    Jul. 11, 2013

Related U.S. Application Data

(63) Continuation of application No. PCT/JP2011/073133, filed on Oct. 6, 2011.

(30) Foreign Application Priority Data

Oct. 8, 2010 (JP) ................................ 2010-228500

(51) Int. Cl.
*G09G 3/10* (2006.01)
*H05B 33/08* (2006.01)
*H05B 37/03* (2006.01)

(52) U.S. Cl.
CPC ............ *H05B 33/08* (2013.01); *H05B 33/0818* (2013.01); *Y02B 20/346* (2013.01); *Y02B 20/325* (2013.01); *H05B 37/03* (2013.01); *H05B 33/0827* (2013.01); *H01L 2251/568* (2013.01)
USPC ........... 315/169.3; 345/76; 345/214; 324/537

(58) Field of Classification Search
USPC .................. 315/169.3; 345/36, 45, 76, 214; 324/537
See application file for complete search history.

(56) References Cited

U.S. PATENT DOCUMENTS 7,226,332 B2    6/2007 Arai et al.
7,759,859 B2    7/2010 Arai et al.
(Continued)

FOREIGN PATENT DOCUMENTS

CN    1648643 A    8/2005
CN    1971695 A    5/2007
(Continued)

OTHER PUBLICATIONS

International Search Report issued on Dec. 20, 2011 for PCT/JP2011/073133 filed on Oct. 6, 2011 with English Translation.
(Continued)

*Primary Examiner* — Thuy Vinh Tran
(74) *Attorney, Agent, or Firm* — Oblon, Spivak, McClelland, Maier & Neustadt, L.L.P.

(57) ABSTRACT

A method of controlling an illumination apparatus includes a malfunction detecting step for detecting a malfunction of an organic electroluminescence element based on its electrical characteristic, a short-circuit malfunction restoration step for applying a short-circuit malfunction restoration pulse to an element that is determined to be a short-circuit malfunction, a short-circuit malfunction restoration determination step for determining whether the element that is determined to be the short-circuit malfunction is restored, a malfunctioning element determination step for storing into a storage, when an element that is determined to be the short-circuit malfunction is not restored, individual information including identification information on the element as a malfunctioning element, and a turn-on control step for controlling the turn-on state of a light-emitting surface based on a state of distribution of the malfunctioning organic electroluminescence elements.

20 Claims, 22 Drawing Sheets

(56) References Cited

U.S. PATENT DOCUMENTS

| | | | |
|---|---|---|---|
| 8,242,787 B2* | 8/2012 | Hente et al. | 324/537 |
| 8,525,757 B2* | 9/2013 | Nishi et al. | 345/76 |
| 2003/0160703 A1 | 8/2003 | Kurose | |
| 2005/0237493 A1 | 10/2005 | Tajiri | |
| 2009/0027313 A1 | 1/2009 | Miyamoto et al. | |
| 2011/0007102 A1* | 1/2011 | Ogura et al. | 345/690 |
| 2011/0227906 A1* | 9/2011 | Shirasaki et al. | 345/212 |

FOREIGN PATENT DOCUMENTS

| | | |
|---|---|---|
| CN | 101174376 A | 5/2008 |
| CN | 101261803 A | 9/2008 |
| CN | 101291558 A | 10/2008 |
| JP | 9-293588 A | 11/1997 |
| JP | 11-162637 | 6/1999 |
| JP | 11-162660 A | 6/1999 |
| JP | 2003-29710 A | 1/2003 |
| JP | 2003-234187 A | 8/2003 |
| JP | 2003-249383 A | 9/2003 |
| JP | 2003-347068 A | 12/2003 |
| JP | 2004-31335 | 1/2004 |
| JP | 2004-199970 | 7/2004 |
| JP | 2005-331906 A | 12/2005 |
| JP | 2006-210114 A | 8/2006 |
| JP | 2007-207703 | 8/2007 |
| JP | 2008-276030 A | 11/2008 |
| JP | 2009-25735 A | 2/2009 |
| JP | 2009-266687 | 11/2009 |
| JP | 2010-20214 | 1/2010 |
| JP | 2010-147257 | 7/2010 |
| JP | 2010-524151 | 7/2010 |

OTHER PUBLICATIONS

International Written Opinion issued on Dec. 20, 2011 for PCT/JP2011/073133 filed on Oct. 6, 2011.
Chinese Office Action dated Apr. 17, 2014, issued in Chinese Patent Application No. 201180047676.0 (with English translation).
Chinese Search Report dated Apr. 17, 2014, issued in Chinese Patent Application No. 201180047676.0 (with English translation).

* cited by examiner

METHOD OF CONTROLLING ILLUMINATION APPARATUS

CROSS REFERENCE TO RELATED APPLICATIONS

This application is a continuation of PCT application No. PCT/JP2011/073133, which was filed on Oct. 6, 2011 based on Japanese Patent Application (No. 2010-228500) filed on Oct. 8, 2010, the contents of which are incorporated herein by reference. Also, all the references cited herein are incorporated as a whole.

BACKGROUND

1. Technical Field

The present invention relates to a method of controlling an illumination apparatus, and in particular, to a method of controlling an illumination apparatus having organic electroluminescence elements.

2. Background Art

An organic electroluminescence element (hereinafter, referred to as an organic EL element) has a structure in which an organic EL layer including a light-emitting layer and electrodes including an anode and a cathode arranged to face each other with the organic EL layer interposed therebetween are laminated on a substrate. At the time of the turn-on of the organic EL element configured as above, defects, such as short-circuit between the electrodes, may occur due to mixing of foreign substances in the organic layer during manufacturing or formation irregularity of the organic layer.

In order to cope with such defects, when defects, such as short-circuit, are found in product checking during manufacturing, defective elements are excluded or restored. However, since the organic EL element is formed of an organic material, alteration, such as thermal decomposition, may occur or molecular diffusion of organic molecules, such as electrophoresis, due to an electric field applied at the time of the turn-on may occur. For this reason, after shipment, defects, such as short-circuit between the electrodes of an organic EL element being used, may occur.

In an illumination apparatus having organic EL elements, if a short-circuit malfunction occurs in an organic EL element, since a short-circuited area is not turned on and a large current flows in the short-circuited area, the emission state of a different organic EL element to which power is supplied from the same power feed unit is darkened or is not turned on. As a result, irregularity in the emission state of the illumination apparatus, such as luminance, occurs over a wide range, and a non-conduction malfunction, such as disconnection of an organic EL element or wiring, occurs due to a rise in temperature of a specific element, causing degradation in quality.

In particular, when a plurality of organic EL elements having different emission colors are arranged to form a light-emitting surface of an illumination apparatus, if an organic EL element having a specific emission color is not turned on, an illumination color changes or color irregularity in an emission color occurs, and a non-conduction malfunction occurs due to a rise in temperature of a specific element, causing degradation in quality. Furthermore, the number of not-turned-on elements increases, and the appearance of the illumination apparatus is deteriorated.

As a method of restoring a short-circuit malfunction, a method in which an overcurrent flows in the short-circuited area with the application of a reverse voltage pulse to the short-circuited area to generate Joule heat, and the short-circuited area is disconnected using heat and restored (JP-A-11-162637), and a method in which a reverse bias voltage is applied to the short-circuited area to disconnect and restore the short-circuited area (JP-A-2007-207703) are known. A method in which a device for diagnosis is used to diagnose a malfunction state of an organic EL element (JP-T-2010-524151) is also known.

SUMMARY

However, according to the techniques of the related art described in the literatures, since there is no clear determination standard for determining whether or not a malfunction occurs with high accuracy when detecting a malfunction of an organic EL element, it is still difficult to reliably determine a malfunction. Furthermore, a rise in temperature of a specific element or a non-conduction malfunction due to the occurrence of irregularity in the emission state at the time of turn-on of a malfunctioning element or irregularity in an illumination color still remains.

The present invention has been accomplished in order to solve the above-described problems, and an object of the invention is to provide a method of controlling an illumination apparatus capable of accurately detecting a malfunction of an organic EL element and improving the quality of the illumination apparatus.

In order to attain the above-described object, the invention provides a method of controlling an illumination apparatus in which a light-emitting surface is formed by a single light-emitting panel or a plurality of light-emitting panels having a plurality of organic electroluminescence elements with different emission colors arranged in a stripe shape. The method includes a malfunction detection step of detecting a malfunction of each of the organic electroluminescence elements based on an electrical characteristic of the organic electroluminescence element, a short-circuit malfunction restoration step of performing short-circuit malfunction restoration processing on an element which is determined to be a short-circuit malfunction in the malfunction detection step, a short-circuit malfunction restoration determination step of determining whether or not the element which is determined to be the short-circuit malfunction is restored after the short-circuit malfunction restoration step, a malfunctioning element determination step of, when it is determined in the short-circuit malfunction restoration determination step that the element which is determined to be the short-circuit malfunction is not restored, repeating the short-circuit malfunction restoration step and the short-circuit malfunction restoration determination step, and when the number of determinations that the element which is determined to be the short-circuit malfunction is not restored exceeds a predetermined number of times, storing individual information including identification information of the element as a malfunctioning element in a storage, and a turn-on control step of controlling a turn-on state of the light-emitting surface based on a state of distribution of malfunctioning elements whose individual information is stored in the malfunctioning element determination step.

In the method of controlling the illumination apparatus, the malfunction detection step may include a driving step of driving the organic electroluminescence element, a measurement step of measuring the electrical characteristic of the organic electroluminescence element in a driving state where the organic electroluminescence element is driven, a reference range setting step of setting a reference range for the electrical characteristic measured in the measurement step, and a malfunction determination step of, when the electrical characteristic measured in the measurement step is outside the reference range set in the reference range setting step, determining to be a malfunction of the organic electroluminescence element.

In the method of controlling the illumination apparatus, it is preferable that the driving step includes a turn-on driving step in which the organic electroluminescence element is driven in a turn-on state, and the malfunction determination step includes a first malfunction determination step of, when an element is driven in the turn-on driving step, determining to be a non-conduction malfunction if a voltage value measured as the electrical characteristic in the measurement step is greater than a predetermined reference voltage range serving as the reference range, and determining to be a short-circuit malfunction if the measured voltage value is smaller than the predetermined reference voltage range.

The driving step may include a turn-off state driving step in which the organic electroluminescence element is driven in a turn-off state, and the malfunction determination step may include a second malfunction determination step of, when an element is driven in the turn-off driving step, determining to be a short-circuit malfunction when the electrical characteristic measured in the measurement step is outside the reference range.

The method may further include, before the measurement step, a driving step of driving the organic electroluminescence element. The driving step may include a turn-on driving step in which the organic electroluminescence element is driven in a driving state to be turned on, and a turn-off driving step in which the organic electroluminescence element is driven in a driving state to be turned off. The malfunction determination step may include a first malfunction determination step of, when an element is driven in the turn-on driving step, determining to be a non-conduction malfunction if a voltage value measured as the electrical characteristic in the measurement step is greater than a predetermined reference voltage range serving as the reference range, and determining to be a short-circuit malfunction if the measured voltage value is smaller than the predetermined reference voltage range, and a second malfunction determination step of, when an element is driven in the turn-off driving step, determining to be a short-circuit malfunction if the electrical characteristic measured in the measurement step is outside the reference range. The second malfunction determination step may be performed after it is determined to be a short-circuit malfunction in the first malfunction determination step.

In the reference range setting step, the predetermined reference voltage range may be corrected in correspondence to at least one of change depending on a temperature in a current-voltage characteristic of the organic electroluminescence element and a change depending on an integrated time of a turn-on time and an initial variation due to migration, or the like.

In the correction of the predetermined reference voltage range, the correction of the predetermined reference voltage range corresponding to the change depending on temperature may be performed using a predefined temperature correction factor.

In the correction of the predetermined reference voltage range, the correction of the predetermined reference voltage range corresponding to the change depending on the integrated time of the turn-on time and the initial variation may be performed using a time-dependent correction factor which is set to correspond to time-dependent change and initial variation of the organic electroluminescence element.

In the correction of the predetermined voltage range, the correction of the predetermined reference voltage range corresponding to the initial variation may be performed when the integrated time of the turn-on time of the organic electroluminescence elements is within 10 to 40 hours from the start of initial electrification.

The predetermined reference voltage range may be set to include an individual difference between the organic electroluminescence elements.

The predetermined reference voltage range may be set in different ranges for the emission colors of the organic electroluminescence elements.

It is preferable that, in the turn-off driving step, a current which is supplied to the electroluminescence element is equal to or greater than 1.0 and equal to or smaller than 1.8 times a standard current flowing when a voltage at a built-in potential obtained by $(\phi p-\phi n)/e$ is applied, where $\phi p$ indicates a work function of an electrode material of a positive electrode, $\phi n$ indicates a work function of an electrode material of a negative electrode, and e indicates the elementary charge, the positive electrode and the negative electrode constituting the organic electroluminescence element.

The electrical characteristic in the second malfunction determination step may be a voltage value, the reference range may be equal to or greater than a predetermined voltage value, and the predetermined voltage value may be equal to or greater than 0.5 times and equal to or smaller than 1.0 times the built-in potential.

Alternatively, a voltage which is applied to the electroluminescence element in the driving state in the second malfunction determination step may be equal to or greater than 0.7 times and equal to or smaller than 1.0 times a built-in potential obtained by $(\phi p-\phi n)/e$, where $\phi p$ indicates a work function of an electrode material of a positive electrode, $\phi n$ indicates a work function of an electrode material of a negative electrode, and e indicates the elementary charge, the positive electrode and the negative electrode constituting the organic electroluminescence elements.

In this case, the electrical characteristic in the second malfunction determination step may be a current value, the reference range may be equal to or smaller than a predetermined current value, and the predetermined current value may be equal to or greater than 1.5 and equal to or smaller than 8 times a standard current flowing when a voltage equal to the built-in potential is applied to a normal organic electroluminescence element.

When performing the second malfunction determination step, a voltage which is applied to the organic electroluminescence element in the driving state may be 0.1 to 4 V.

It is preferable that, in the turn-off driving step, a voltage which is applied to the organic electroluminescence elements is a voltage in a reverse voltage direction.

The driving state may be constant-voltage driving in which a constant voltage is applied to the organic electroluminescence elements or constant-current driving in which a constant current flows in the organic electroluminescence elements.

In the method of controlling the illumination apparatus, before the turn-on driving step or the turn-off driving step, the storage may store therein, in advance, a reference voltage range map which is used for the predetermined reference voltage range of the organic electroluminescence element, a temperature compensation factor map which is used for compensation corresponding to change in temperature with respect to the voltage of the organic electroluminescence element, and a time-dependent compensation factor map which is used for compensation corresponding to the integrated time of the turn-on time with respect to the voltage of the organic electroluminescence element and compensation corresponding to variation in voltage in the initial turn-on of the organic electroluminescence element.

In the method of controlling the illumination apparatus, it is preferable that the short-circuit malfunction restoration determination step performs the turn-on driving step, the measurement step, the reference range setting step, and the first malfunction determination step when the short-circuit malfunction restoration step is performed after the first malfunction determination step, and performs the turn-off driving step, the measurement step, the reference range setting step, and the second malfunction determination step when the short-circuit malfunction restoration step is performed after the second malfunction determination step.

Here, it is preferable that a short-circuit malfunction restoration is performed when it is determined to be a short-circuit malfunction in the first malfunction determination and the second malfunction determination.

The short-circuit malfunction restoration pulse may be selected from a reverse voltage pulse, an overvoltage pulse greater than a forward voltage in the driving state, and an overcurrent pulse greater than a forward current in the driving state.

Specifically, the magnitude of the reverse voltage pulse which is used as the short-circuit malfunction restoration pulse may be equal to or greater than 10 V and equal to or smaller than 50 V.

Alternatively, the magnitude of the forward overvoltage pulse which is used as the short-circuit malfunction restoration pulse may be equal to or greater than 8 V and equal to or smaller than 20 V.

The magnitude of the forward overcurrent pulse which is used as the short-circuit malfunction restoration pulse may be equal to or greater than three times and equal to or smaller than 20 times the current during normal turn-on.

The predetermined number of times may be equal to or greater than two and equal to or smaller than ten.

The predetermined number of times in which an organic EL element determined to be a non-conduction malfunction is determined as a malfunctioning element may be equal to or greater than two and equal to or smaller than ten.

In the method of controlling the illumination apparatus, it is preferable that, in the turn-on control step, distribution information of malfunctioning elements whose individual information is stored in the malfunctioning element determination step is obtained, and the turn-on state of each of normal organic electroluminescence elements other than the malfunctioning elements is controlled based on the distribution information such that an emission pattern in the light-emitting surface becomes regular.

Here, the emission pattern may be controlled regularly by ensuring each of the normal organic electroluminescence elements has a gradient according to a distance from a malfunctioning element. For example, adjustment may be made such that an element close to the malfunctioning element has low luminance, and an element away from the malfunctioning element increases in luminance.

In the turn-on control step, power feed to the malfunctioning element may be stopped.

In the turn-on control step, luminance adjustment may be performed so as to adjust the luminance of each of the normal organic electroluminescence elements other than the malfunctioning elements such that luminance in the light-emitting surface is substantially uniform.

Here, control may be performed such that a deviation in luminance is within 15% in an area of a $\frac{1}{5}$ angle of the minor axis of the organic electroluminescence elements. The minor axis represents the length in a lateral direction when a light-emitting element has a rectangular shape, a diameter when a light-emitting element has a circular shape, or a minor axis when a light-emitting element has an elliptical shape.

Here, the luminance adjustment may increase the luminance of each of the normal organic electroluminescence elements with the same color as the emission color of the malfunctioning element in a predetermined area including the malfunctioning element and may decrease the luminance of each of the normal organic electroluminescence elements with a color different from the emission color of the malfunctioning element in the predetermined area.

In a case of adjustment for each emission color, control may be performed such that a color difference in an area of a $\frac{1}{5}$ angle of the minor axis of the organic electroluminescence elements falls within MacAdam 3Step with respect to a standard value.

Here, the luminance adjustment turn-on may be at least one of an operation to increase the luminance of each of the normal organic electroluminescence elements in a predetermined area including the malfunctioning element and an operation to decrease the luminance of each of the normal organic electroluminescence elements outside the predetermined area.

The luminance adjustment turn-on may change the luminance of each of the normal organic electroluminescence elements at a predetermined time interval.

The turn-on state may be pattern turn-on in which the normal organic electroluminescence elements are turned on or turned off to form a predetermined turn-on pattern in the light-emitting surface.

The pattern turn-on may switch the turn-on and turn-off of each of the normal organic electroluminescence elements at a predetermined time interval.

In the turn-on control step, the surface temperature of each of the normal organic electroluminescence elements other than the malfunctioning element may be adjusted such that the surface temperature of the light-emitting surface is substantially uniform.

Here, control may be performed such that variation in temperature in the area of a $\frac{1}{5}$ angle of the minor axis of the organic electroluminescence elements is within 10° C.

The temperature adjustment turn-on may change the surface temperature of each of the normal organic electroluminescence elements at a predetermined time interval.

In the turn-on control step, distribution information of malfunctioning elements whose individual information is stored in the malfunctioning element determination step may obtained, and at least two of turn-on state control for controlling the turn-on state of each of the normal organic electroluminescence elements other than the malfunctioning element based on the distribution information such that an emission pattern in the light-emitting surface becomes regular, power feed stop control for stopping power feed to the malfunctioning element, luminance adjustment for adjusting the luminance of each of the normal organic electroluminescence elements other than the malfunctioning element such that luminance in the light-emitting surface is substantially uniform, and temperature adjustment for adjusting the surface temperature of each of the normal organic electroluminescence elements other than the malfunctioning element such that the surface temperature of the light-emitting surface is substantially uniform may be performed in combination.

The turn-on control step may perform at least one of the turn-on state control, the power feed stop control, the luminance adjustment, and the temperature adjustment at a predetermined time interval.

Turn-on control information may be registered in the storage in advance before the turn-on control step, the turn-on control information may include at least one of a current-luminance characteristic map of the organic electroluminescence elements, the heat generation parameters of the organic electroluminescence elements, characteristic balance data of the respective colors of the organic electroluminescence elements, the maximum current value of the organic electroluminescence elements, and a visibility correction map for the emission luminance of the organic electroluminescence elements, and the turn-on control step may be performed based on the turn-on control information.

In the method of controlling the illumination apparatus configured as above, the malfunction detection step and the turn-on control step may be performed by a computer unit.

In the method of controlling the illumination apparatus, the illumination apparatus may include a communication unit, and the method may further include a communication step of connecting the communication unit to a communication unit of an external apparatus to communicate with the communication unit of the external apparatus.

In the communication step, read or write of data stored in the storage may be performed.

With the communication step, the turn-on control step may be performed based on information from the external apparatus through the communication unit.

In the method of controlling the illumination apparatus configured as above, the first malfunction determination step, the second malfunction determination step, and the turn-on control step may be executed by a program which is stored in the storage device. In this case, the method may include a program change step of rewriting the program.

The external apparatus may be a different illumination apparatus, and the communication step with the different illumination apparatus may be performed using the communication unit.

The external apparatus may be a system controller.

When the illumination apparatus has a communication unit, a plurality of illumination apparatuses may be provided, at least one of the illumination apparatuses may be an external apparatus, and the communication step may be performed between the plurality of illumination apparatuses using the communication units.

The communication step may further include a replacement time notification step of giving notification of the replacement time of the corresponding light-emitting panel from the individual information stored as a malfunctioning element in the storage.

The replacement time notification step may include a replacement time determination step of determining, as a replacement time, when the number of malfunctioning elements stored in the storage exceeds a predetermined number of times set as a replacement time.

It is preferable that, in the replacement time notification step, the predetermined number of times set as the replacement time is equal to or greater than 0.5% and equal to or smaller than 25% of the total number of organic electroluminescence elements in the illumination apparatus.

According to the method of controlling the illumination apparatus of the invention, malfunctions of the organic EL elements are detected based on the electrical characteristics of the organic EL elements, and the turn-on state of the light-emitting surface of the illumination apparatus is controlled based on the state of distribution of the malfunctioning elements. Therefore, it is possible to accurately detect a malfunction of an organic EL element and to improve the quality of the illumination apparatus by making the malfunction of the organic EL element less noticeable.

When it is determined to be a short-circuit malfunction, the short-circuit malfunction restoration pulse having a predetermined pulse width is applied to the organic EL element determined to be a short-circuit malfunction. Therefore, the short-circuited area of the organic EL element determined to be a short-circuit malfunction is disconnected, making it possible to restore the organic EL element.

When the number of determinations that a short-circuited area is not restored exceeds a predetermined number of times, the individual information of the corresponding organic EL element is stored as a malfunctioning element in the storage means. Therefore, it is possible to reliably recognize and clearly discriminate a malfunctioning element.

In the method of detecting a malfunction of an organic EL element, if a voltage value measured in a driving state where an organic EL element is turned on is not in a predetermined voltage range, it is determined to be a malfunction of the organic EL element, thereby determining a malfunction easily and accurately.

If it is determined to be a non-conduction malfunction when the measured voltage value is greater than a predetermined voltage range, and it is determined to be a short-circuit malfunction when the measured voltage value is smaller than the predetermined voltage range, it is possible to more accurately recognize a malfunction state. Furthermore, if it is determined to be a short-circuit malfunction when the electrical characteristics in a driving state where an organic EL element is turned off are not in the reference range, it is possible to perform more accurate malfunction determination.

If the predetermined voltage range as the reference range is corrected to correspond to at least one of the change depending on temperature in the current-voltage characteristics of the organic EL elements, and the integrated time of the turn-on time and the initial variation, it is possible to improve the detection accuracy of a malfunction of the organic EL element.

In particular, if the correction corresponding to the initial variation is performed when the initial variation is liable to occur on the condition that the integrated time of the turn-on time of the organic EL elements is within 10 to 40 hours from the start of electrification, it is possible to further improve the malfunction detection accuracy of the organic EL elements.

If the predetermined voltage range is set so as to include the individual difference between the organic EL elements, even when there is an individual variation between the electrical characteristics of the organic EL elements, it is possible to more accurately detect a malfunction of an organic EL element.

If the predetermined voltage range is set in different ranges depending on the emission colors of the organic EL elements, even when there is a difference between the electrical characteristics of the organic EL elements having different emission colors, it is possible to more accurately detect a malfunction of an organic EL element.

It is determined to be a short-circuit malfunction when malfunction determination is made in a state where an organic EL element is turned on, and thereafter, malfunction determination is made in a state where the organic EL element is turned off. With this, it is possible to more reliably detect an organic EL element with a short-circuit malfunction.

When malfunction determination is made in a state where an organic EL element is turned off, if the measured voltage value is not in the range equal to or greater than the voltage value equal to or greater than 1.0 times and equal to or smaller than 1.8 times the built-in potential obtained from the work functions of the positive and negative electrodes as the reference range, it is determined to be a short-circuit malfunction. With this, it is possible to more clearly discriminate whether or not a malfunction occurs based on a large voltage value occurring in a short-circuit malfunction, thereby detecting a short-circuit malfunction of an organic EL element with high accuracy.

When the measured voltage value is not in the range equal to or greater than the voltage value equal to or greater than 0.5 times and equal to or smaller than 1.0 times the built-in potential obtained from the work functions of the positive and negative electrodes as the reference range, it is determined to be a short-circuit malfunction. With this, it is possible to more clearly discriminate whether or not a malfunction occurs based on a large voltage value occurring in a short-circuit malfunction, thereby further improving the detection accuracy of a short-circuit malfunction.

Alternatively, when malfunction determination is made in a state where an organic EL element is turned off, if the measured current value is not in the range equal to or smaller than the current value equal to or greater than 1.5 times and equal to or smaller than 8 times the standard current when a voltage equal to the built-in potential obtained from the work functions of the positive and negative electrodes is applied to the normal organic EL elements, it is determined to be a short-circuit malfunction. With this, it is possible to more clearly discriminate whether or not a malfunction occurs based on a large current value occurring in a short-circuit malfunction, thereby improving the detection accuracy of a short-circuit malfunction. It is also possible to make malfunction determination without flowing an excessive current.

If the voltage which is applied to an organic EL element in a driving state where an organic EL element is turned off is the voltage in the reverse voltage direction, since a current which does not flow in a normal element flows in a short-circuit malfunctioning element, it is possible to reliably detect a malfunction, and to further improve the detection accuracy of a short-circuit malfunction.

If the reference voltage range map, the temperature compensation factor map, and the time-dependent compensation factor map of the organic EL elements are registered in the storage means in advance before turn-on driving or turn-off driving of the organic EL elements, it is possible to rapidly correct the predetermined voltage range.

When a short-circuited area is restored after malfunction determination is made in a state where the organic EL element is driven to be turned on, the organic EL element is driven to be turned on and the voltage value is measured to make determination on whether or not the short-circuited area of the organic EL element is restored. With this, since the same determination as when it is determined to be a malfunction is made, it is possible to more accurately determine whether or not a malfunction is restored. When a short-circuited area is restored after the organic EL element is driven to be turned off and malfunction determination is made, the organic EL element is driven to be turned off and the current value is measured to determine whether or not the short-circuited area of the organic EL element is restored. With this, since the same determination as when it is determined to be a malfunction is made, it is possible to more reliably determine whether or not a malfunction is restored.

The short-circuit malfunction restoration pulse is selected from the reverse voltage pulse, the overvoltage pulse greater than the forward voltage in the driving state, and the overcurrent pulse greater than the forward current in the driving state. With this, it is possible to more reliably restore a short-circuited area. In particular, in the case of the reverse voltage pulse, it becomes possible to restore the corresponding organic EL element from a short-circuit malfunction while remaining turned-off.

When there is a malfunctioning element through the malfunction determination, the distribution information of the malfunctioning elements in the light-emitting panel is obtained based on malfunctioning element information determined as a malfunctioning element and stored in the storage means, and the turn-on control is performed on the normal organic EL elements from the distribution information such that the emission pattern of the light-emitting surface becomes regular. With this, it is possible to make a malfunction of an organic EL element less noticeable and to reduce a deviation in heat generation of the normal organic EL elements, making it possible to extending the element lifetime of the normal organic EL elements.

If the power feed to the malfunctioning element stored in the storage means is stopped, it is possible to prevent a wasteful current supply and to suppress the occurrence of a non-conduction malfunction accompanied by the malfunctioning element.

If the luminance of each of the normal organic EL elements is adjusted such that the luminance in the light-emitting surface is substantially uniform, it is possible to make a malfunctioning element less noticeable.

The change in the color of illumination light is compensated by increasing the luminance of each of the normal organic EL elements with the same color as the emission color of the malfunctioning element in the predetermined area including the malfunctioning element, and the change in luminance is compensated by decreasing the luminance of each of the normal organic EL elements with a color different from the emission color of the malfunctioning element in the predetermined area, thereby eliminating luminance irregularity.

Even when at least one of the operation to increase the luminance of each of the normal organic EL elements in the predetermined area including the malfunctioning element and the operation to decrease the luminance of each of the normal organic EL elements outside the predetermined area is performed, the turn-on control adjusts the luminance to perform light control of the light-emitting surface, thereby making a malfunctioning element less noticeable.

The luminance of each of the normal organic EL elements at a predetermined time interval changes so as to switch the turn-on and turn-off or the luminance of each organic EL element at a predetermined time interval. With this, it is possible to reduce a deviation in the heat generation of the organic EL elements to reduce the occurrence of a non-conduction malfunction, making it possible to further extend the element lifetime.

The turn-on and turn-off of each of the normal organic EL elements is controlled to form a predetermined turn-on pattern in the light-emitting surface, thereby forming a turn-on pattern so as to make a malfunctioning element less noticeable. In particular, this is effective for the use as a decoration.

If the surface temperature of each of the normal organic EL elements is adjusted such that the surface temperature of the light-emitting surface is substantially uniform, it is possible to eliminate a deviation in the surface temperature of the organic EL elements to reduce the occurrence of a non-conduction malfunction, thereby further extending the element lifetime.

At least two of the turn-on state of the organic EL elements, the stop of power feed to a malfunctioning element, the adjustment of luminance, and the adjustment of surface temperature are performed in combination. With this, the occurrence of a non-conduction malfunction of each organic EL element is reduced, thereby further extending the element lifetime.

If the turn-on state of each of the normal organic EL elements, the stop of power feed to a malfunctioning element, the adjustment of luminance, and the surface temperature are changed at a predetermined time interval, the occurrence of a non-conduction malfunction of each organic EL element is reduced, thereby further extending the element lifetime.

Communication is performed using the communication means of the illumination apparatus and the communication means of the external apparatus. With this, it is possible to control the illumination apparatus from the external apparatus, thereby easily performing the management and operation of the illumination apparatus.

The read or write of data stored in the storage means of the illumination apparatus is performed from the communication means of the external apparatus through the communication means of the illumination apparatus. With this, it is possible to easily perform the management of the illumination apparatus.

The program which performs malfunction detection and turn-on control is rewritten through the communication means. With this, it is possible to improve malfunction detection or turn-on control and to provide an additional function, thereby easily performing the management of the illumination apparatus.

The turn-on control and the read and write of data stored in the storage means are performed through communication between the illumination apparatus and a different illumination apparatus. With this, even when a malfunctioning element is generated, it is possible to secure appropriate illumination light in cooperation with the different illumination apparatus.

Since the illumination apparatus as an external apparatus performs communication with a plurality of illumination apparatuses, it is possible to construct a large-scale illumination system.

If the replacement time of the light-emitting panel is notified through the communication means from the individual information of the malfunctioning element stored in the storage means, since the replacement time of the light-emitting panel is automatically notified, it is possible to easily perform the management of the illumination apparatus.

DETAILED DESCRIPTION

Hereinafter, an embodiment of the invention will be described in detail based on some examples with reference to the drawings. The invention is not limited to the contents described below, and may be arbitrarily changed and carried out without departing from the scope of the invention. The drawings which are used in the following description are for illustration of the illumination apparatus according to the invention, partial emphasis, enlargement, reduction, omission, or the like may be done so as to get more understanding, and the scale, shape, or the like of each constituent member may not be accurately represented. Various numerical values which are used in the following description are just an example, and may be changed in various ways as necessary.

First Example

Figure 1:
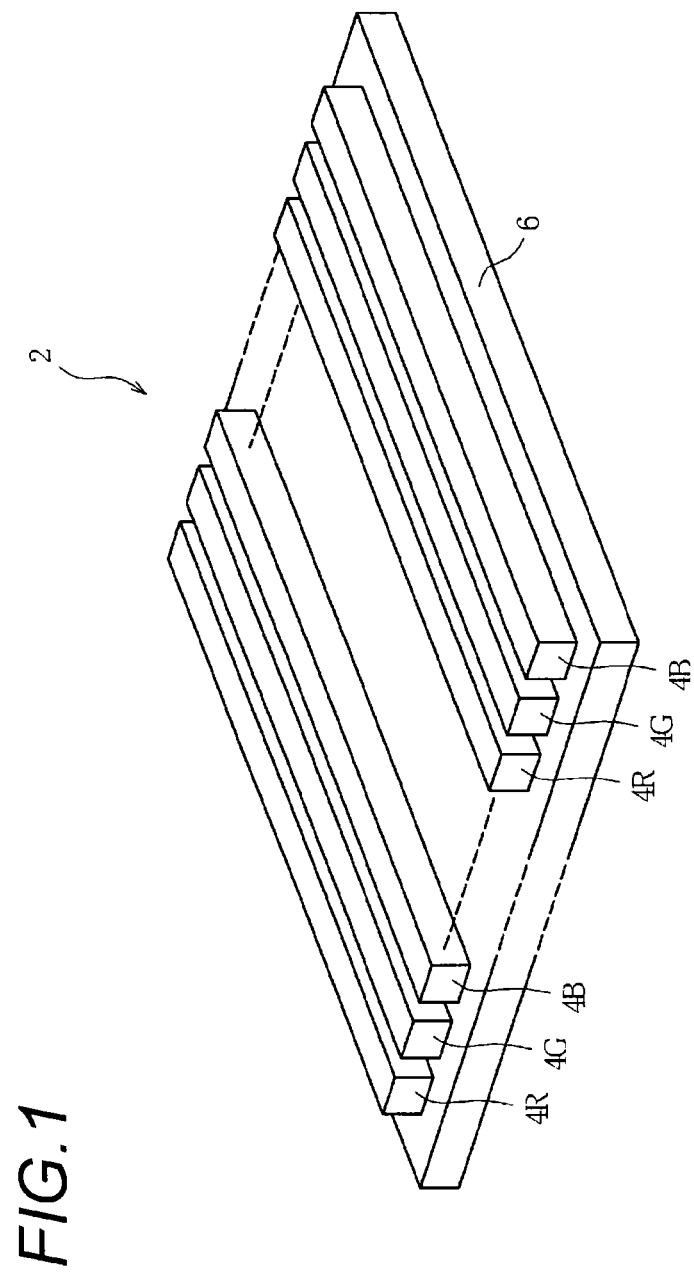
FIG. 1 is a perspective view showing the schematic configuration of an organic EL light-emitting panel according to a first example of the invention.

FIG. 1 is a perspective view showing the schematic configuration of an organic EL light-emitting panel 2 which constitutes an illumination apparatus 1 according to a first example of the invention. As shown in FIG. 1, the organic EL light-emitting panel 2 has a plurality of organic EL elements 4 with different emission colors arranged on a substrate 6 in a stripe shape. In other words, a plurality of rod-shaped organic EL elements 4 are arranged on the substrate 6 in a state where two adjacent organic EL elements 4 are substantially in parallel at a regular interval. Each organic EL element 4 has an organic EL element 4R with a red emission color, an organic EL element 4G with a green emission color, and an organic EL element 4B with a blue emission color, and these organic EL elements are repeatedly arranged on the substrate 6 in this order. When all the organic EL elements of the illumination apparatus 1 are described regardless of the emission color, the organic EL elements are referred to as the organic EL elements 4, and when the organic EL elements should be distinguished in accordance with on the emission color, the organic EL elements are referred to as the organic EL element 4R, the organic EL element 4G, and the organic EL element 4B.

Figure 2:
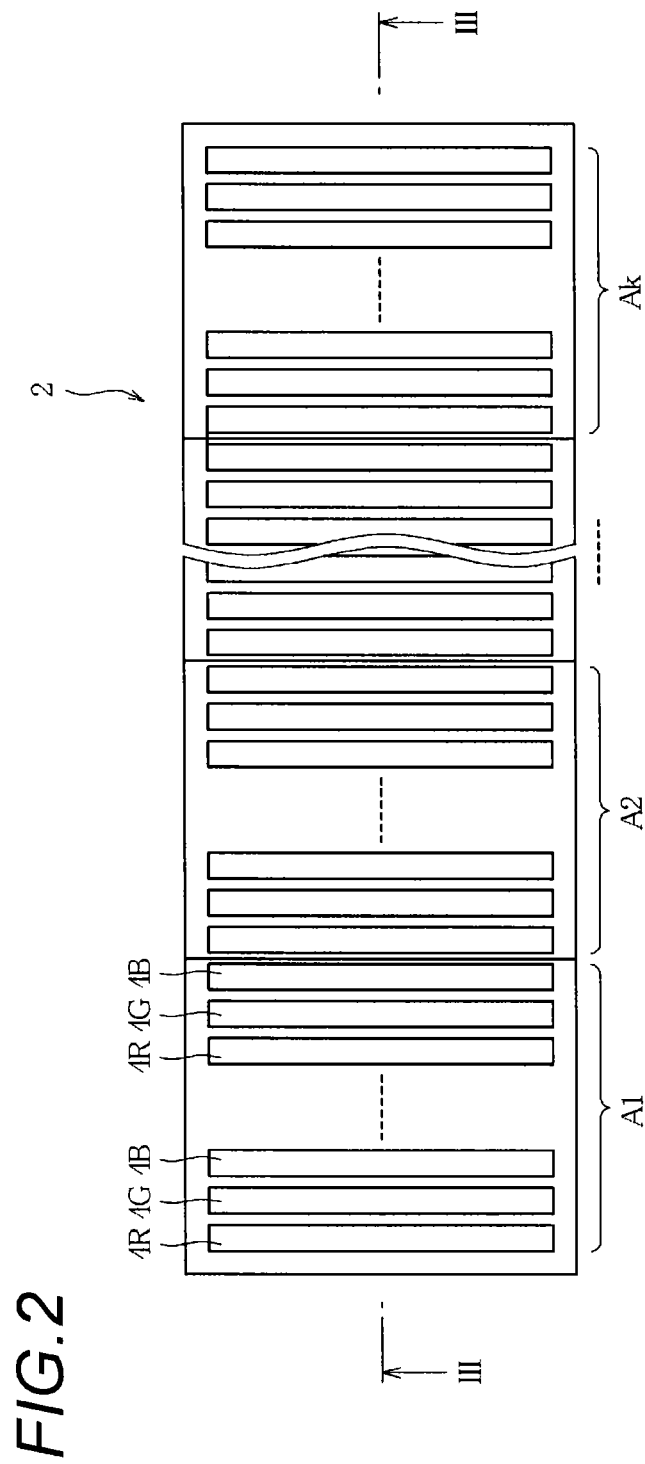
FIG. 2 is a schematic plan view of the organic EL light-emitting panel shown in FIG. 1.

FIG. 2 is a schematic plan view of the organic EL light-emitting panel 2 shown in FIG. 1. The organic EL light-emitting panel 2 is divided into a plurality of emission areas A1 to Ak corresponding to turn-on control described below. In this example, the single organic EL light-emitting panel 2 is provided, and the emission color and the illumination color of the organic EL light-emitting panel 2 are identical. When a plurality of organic EL light-emitting panels 2 are provided, the emission colors of the organic EL light-emitting panels 2 are combined and become an illumination color.

(Substrate)

In this example, the substrate 6 is a glass transparent substrate. As the substrate 6, a metal plate, ceramics, a plastic film, or the like may be used. In particular, a glass transparent substrate which is used in this example, or a transparent resin substrate, such as polyester, polymethacrylate, polycarbonate, or polysulfone, is preferably used.

(Organic EL Element)

In this example, as described above, the organic EL elements 4 are arranged on the substrate 6 in such a manner that the organic EL element 4R with a red emission color, the organic EL element 4G with a green emission color, and the organic EL element 4B with a blue emission color are repeatedly arranged in this order in parallel at regular intervals.

Figure 3:
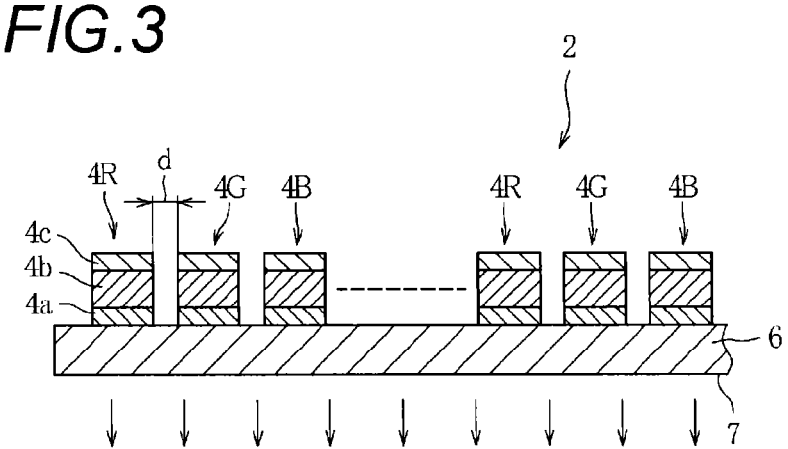
FIG. 3 is a sectional view taken along the line III-III of FIG. 2.

FIG. 3 is a sectional view taken along the line III-III of FIG. 2. Each of the organic EL elements 4R, 4G, and 4B has a configuration in which an anode 4a as an electrode layer is formed on the substrate 6, an organic layer 4b as a charge transport layer is laminated on the anode 4a, and a cathode 4c which is paired with the anode 4a is laminated on the organic layer 4b.

The anode 4a has a function of injecting holes into the organic layer 4b, and is formed of metal oxide, such as indium tin oxide (ITO) or indium zinc oxide, metal, such as aluminum, gold, silver, nickel, palladium, or platinum, metal halide, such as copper iodide, or conductive polymer, such as carbon black, poly(3-methyl thiophene), or polypyrrole. The anode 4a is formed by sputtering, vacuum deposition, or the like. It is preferable that, after the anode 4a is formed, an impurity stuck to the anode 4a is removed, and ultraviolet irradiation or ozonation is performed so as to improve hole injection performance with the adjustment of an ionization potential.

The organic layer 4b may usually has a light-emitting layer, or a hole injection layer, a hole transport layer, a light-emitting layer, an electron transport layer, and an electron injection layer, and may further have other layers. The hole injection layer facilitates hole injection from the anode 4a, and the hole transport layer has a function of transporting holes to the light-emitting layer. The hole transport layer is formed of, for example, a hole transport material, such as an aromatic amine derivative, a polyaniline derivative, or a polypyrrole derivative.

The electron injection layer facilitates injection of electrons from the cathode 4c, and the electron transport layer has a function of transporting electrons to the light-emitting layer. The electron transport layer is formed of, for example, an electron transport material, such as an oxadiazole derivative.

The light-emitting layer recombines holes and electrons respectively injected from the anode 4a and the cathode 4c, and emits fluorescence. Examples of a light-emitting material for forming the light-emitting layer include a polyfluorene derivative, a polyspirofluorene, and the like. Light emitted from the light-emitting layer differs in an emission color of red, green, or blue with the change of the light-emitting material.

It is preferable that the thickness of each layer constituting the organic layer 4b is equal to or smaller than 100 nm.

In general, heretofore, the anode 4a of each organic EL element 4 is electrically bonded along a transparent electrode pattern (not shown) formed on the substrate 6, and a transparent electrode (not shown) is electrically bonded to the cathode 4c of the organic EL element 4, such that a current for driving each organic EL element 4 can be supplied.

The arrangement interval d of the organic EL elements 4R, 4G, and 4B is usually several hundred μm to several cm. With this arrangement of the organic EL elements 4R, 4G, and 4B, in the organic EL light-emitting panel 2, the light components of red, green, and blue emitted from the organic EL elements 4R, 4G, and 4B are combined, and the combined light irradiated from a light-emitting surface 7 of the substrate 6 opposite to the mounting surface of the organic EL elements 4 is viewed as white light.

(Configuration of Illumination Apparatus)

Figure 4:
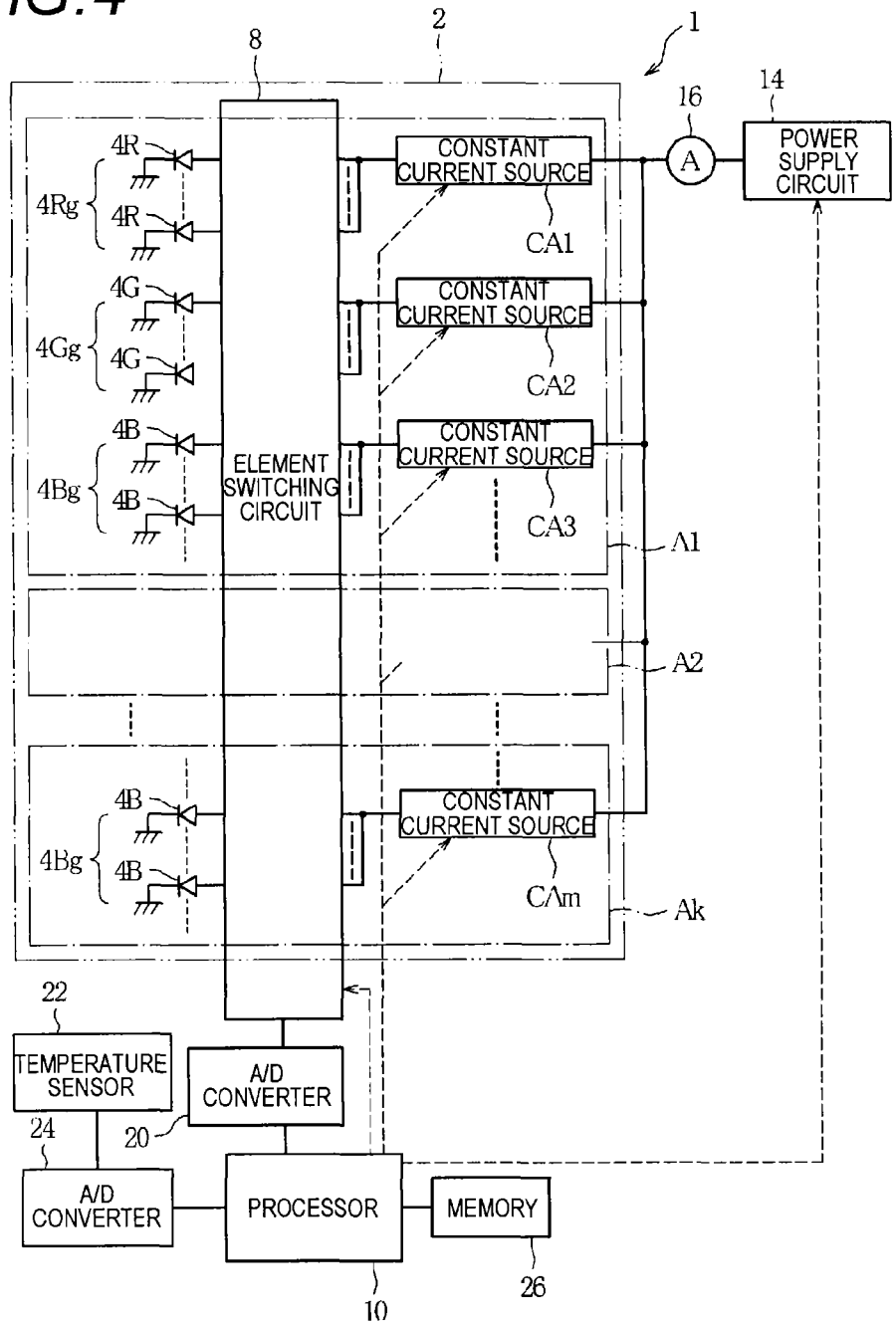
FIG. 4 is a schematic configuration diagram of an illumination apparatus according to the first example of the invention.

FIG. 4 is a schematic configuration diagram showing the outline of the illumination apparatus 1 according to the first example of the invention. The illumination apparatus 1 is configured to perform malfunction detection and turn-on control of each organic EL element 4 described below.

As shown in FIG. 4, in the organic EL elements 4, a plurality of organic EL elements 4R with an emission color, for example, a red emission color are connected in parallel to constitute one element group 4Rg. Similarly, a plurality of organic EL elements 4G with a green emission color are connected in parallel to constitute an element group 4Gg, and a plurality of organic EL elements 4B with a blue emission color are connected in parallel to constitute an element group 4Bg. Constant current source circuits CA1 to CAm are arranged to correspond to the element groups 4Rg, 4Gg, and 4Bg. In the single organic EL light-emitting panel 2, a plurality of emission areas A1 to Ak each having the element groups 4Rg, 4Gg, and 4Bg are arranged. The emission area A1 is the first emission area, and the emission area Ak is the k-th emission area.

The element groups 4Rg, 4Gg, and 4Bg are connected to an element switching circuit 8. The element switching circuit 8 switches an organic EL element 4 as a subject for malfunction detection and turn-on control in response to a signal input from a processor (computer unit) 10, and connect the subject organic EL element 4 to a corresponding one of the constant current source circuits CA1 to CAm. If an organic EL element 4 selected as a subject is connected to the corresponding constant current source circuit, a current flows into the subject organic EL element 4 from a power supply circuit 14 through the constant current source circuit, and the current at this time is adjusted to a predetermined current value by the constant current source circuit connected to the subject organic EL element 4. The power supply circuit 14 is connected to the processor 10, and the output voltage thereof is controlled by the processor 10. The constant current source circuit CA1 is the first constant current source circuit, and the constant current source circuit CAm is the m-th constant current source circuit. A constant current source circuit provided corresponding to an organic EL element 4 selected as a subject is referred to as a constant current source circuit CAj.

The anode of each organic EL element 4 is connected to the element switching circuit 8, and the voltage (hereinafter, referred to as the voltage of the organic EL element 4) on the anode side of each organic EL element 4 corresponds to the selection of the organic EL element 4 in the element switching circuit 8, and input to the processor 10 through an A/D converter 20. Specifically, though not shown, the voltage of each organic EL element 4 selected as a detection element is measured by the processor 10 to correspond to the switching of each organic EL element 4 as a subject in the element switching circuit 8.

A temperature sensor 22 is provided for each organic EL light-emitting panel 2 or each organic EL element 4, and measures the temperature of each organic EL light-emitting panel 2 or each organic EL element 4. The measured temperature is input to the processor 10 through an A/D converter 24 as a parameter for calculating temperature information of each organic EL light-emitting panel 2 or each organic EL element 4. The processor 10 includes a central processing unit (hereinafter, referred to as a CPU), a memory, and the like, calculates a controlled variable from an input voltage value, temperature, or the like, and controls the organic EL elements 4 through the element switching circuit 8 or controls the power supply circuit 14 or the constant current source circuits CA1 to CAm. A memory 26 is connected to the processor 10, and the processor 10 performs data read and write with respect to the memory 26. The memory 26 is a nonvolatile memory, and includes, for example, a ROM, a RAM, or the like.

(Electrical Circuit Configuration of Illumination Apparatus)

Figure 5:
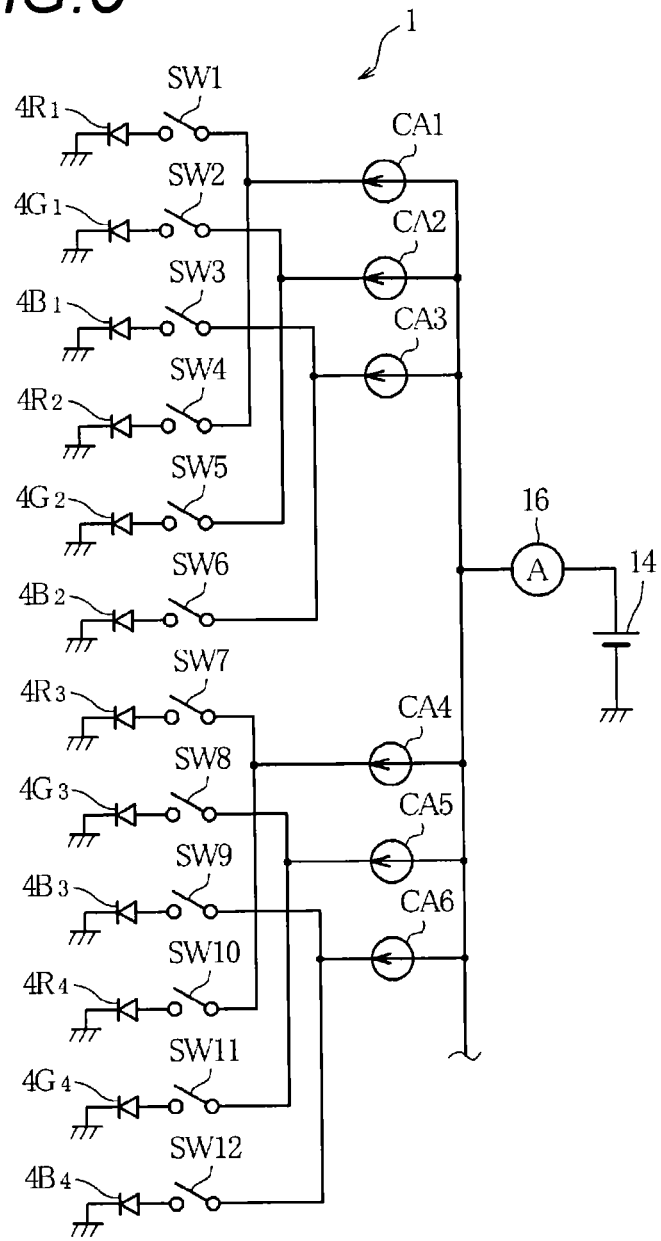
FIG. 5 is an electrical circuit diagram of a part of a circuit diagram of the illumination apparatus according to the first example of the invention.

FIG. 5 is an electrical circuit diagram of a part of a circuit of one emission area in the illumination apparatus 1 of this example. As shown in FIG. 5, the anode of an organic EL element $4R_1$ with a red emission color is connected to the constant current source circuit CA1 through a switch SW1, and the anode of an organic EL element $4R_2$ is connected to the constant current source circuit CA1 through a switch SW4. Accordingly, the organic EL element $4R_1$ and the organic EL element $4R_2$ form the same element group 4Rg. The anode of an organic EL element $4G_1$ with a green emission color is connected to the constant current source circuit CA2 through a switch SW2, and the anode of an organic EL element $4G_2$ is connected to the constant current source circuit CA2 through a switch SW5. Accordingly, the organic EL element $4G_1$ and the organic EL element $4G_2$ form the same element group 4Gg. The anode of an organic EL element $4B_1$ with a blue emission color is connected to the constant current source circuit CA3 through a switch SW3, and the anode of an organic EL element $4B_2$ is connected to the constant current source circuit CA3 through a switch SW6. Accordingly, the organic EL element $4B_1$ and the organic EL element $4B_2$ form the same element group 4Bg. The constant current source circuits CA1 to CA6 are connected to the power supply circuit 14. Although in FIG. 5, for convenience of description, each of the element groups 4Rg, 4Gg, and 4Bg has two organic EL elements 4, the number of organic EL elements 4 in each of the element groups 4Rg, 4Gg, and 4Bg is not limited thereto, each of the element groups 4Rg, 4Gg, and 4Bg may have more organic EL elements 4.

Though not shown, in the element switching circuit 8, the ON/OFF of each switch SW is switched in response to a control signal from the processor 10, and an organic EL element 4 to which a current is supplied is selected. As described below, the control signal is applied sequentially to the switches SW1 to SWn with shift of a predetermined time, such that the ON/OFF of the switches SW1 to SWn is sequentially switched. Each of the switches SW1 to SWn is interposed between the organic EL element 4 and the corresponding constant current source circuit. The switch SW1 is the first switch, and the switch SWn is the n-th switch. A switch corresponding to an organic EL element 4 selected as a subject is referred to as a switch SWi. Although the control example is a control system example based on control of a constant current value, in FIG. 5, PWM control in which the switch SW1 to the switch SW12 are ON/OFF cyclically, and DUTY (duty ratio) is variable may be performed.

(Control of Illumination Apparatus)

Figure 6:
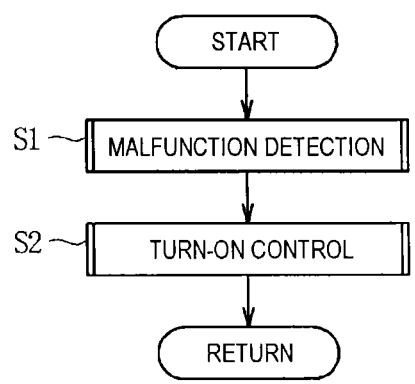
FIG. 6 is a flowchart showing the control of the illumination apparatus according to the first example of the invention.

The control of the illumination apparatus 1 according to the first example of the invention configured as above will be described below. FIG. 6 is a flowchart showing the control of the illumination apparatus 1. Each program according to the flowchart stored in the memory 26 is executed by the processor 10 in each predetermined cycle, thus the following processing is performed.

(Malfunction Detection of Organic EL Element)

In Step S1, the voltage of each organic EL element 4 in the illumination apparatus 1 is sequentially measured, and malfunction detection is performed (malfunction detection step).

Figure 7:
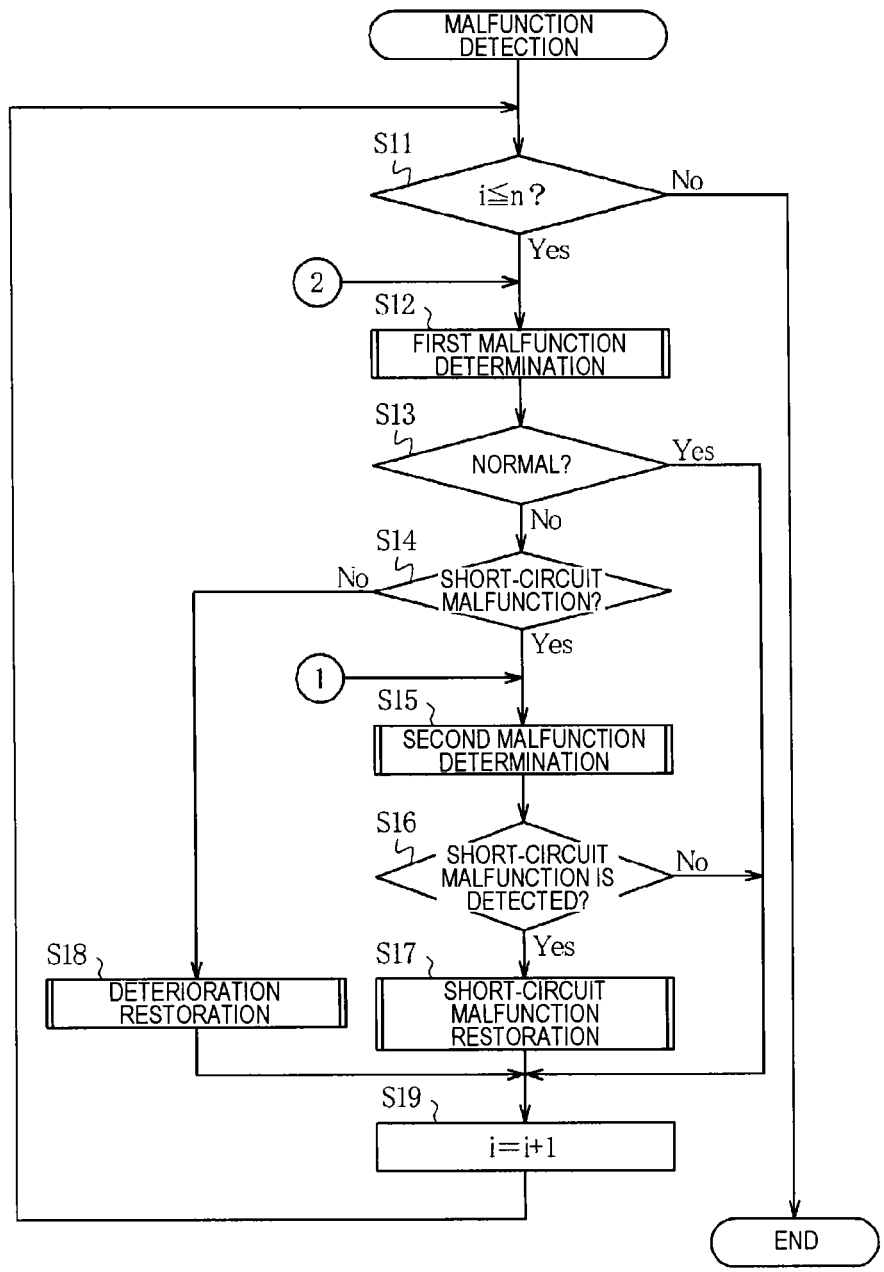
FIG. 7 is a flowchart showing a malfunction detection routine in the control of the illumination apparatus.

Specifically, FIG. 7 is a flowchart of a malfunction detection routine, and description will be provided in accordance with the flowchart with reference to the drawings.

In Step S11, it is determined whether or not the number i of organic EL elements 4 selected as an element subjected to detection from the processor 10 is equal to or smaller than the total number n of organic EL elements 4. When the determination result is true (Yes), since malfunction detection of all organic EL elements 4 is not completed, the process progresses to Step S12. When the determination result is false (No), it is determined that malfunction detection of all organic EL elements 4 ends, the malfunction detection routine ends, and the process progresses to Step S2.

In Step S12, first malfunction determination is performed for an organic EL element 4 as a subject for detection. At this time, the processor 10 outputs, as an instruction value, a predetermined current value to a constant current source circuit CAj provided corresponding to the organic EL element 4 as a subject for detection. When receiving the instruction value, the constant current source circuit CAj adjusts a current flowing into each organic EL element 4 from the power supply circuit 14 to a predetermined current value instructed from the processor 10. Each organic EL element 4 is driven with the current supply and becomes the turn-on state. The first malfunction determination is performed under the following condition.

Figure 8:
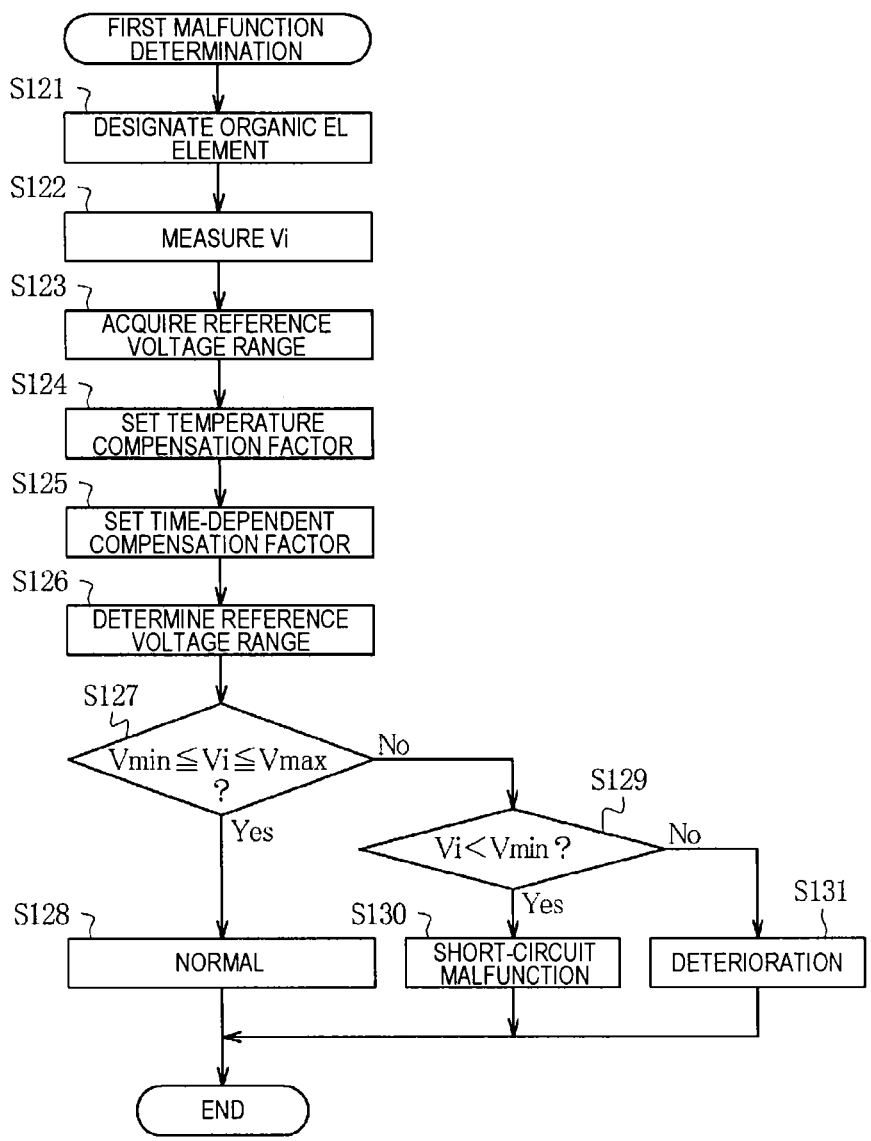
FIG. 8 is a flowchart showing a first malfunction determination routine which is performed in the malfunction detection routine shown in FIG. 7.

Specifically, FIG. 8 is a flowchart of a first malfunction determination routine, and description will be provided based on the flowchart. In Step S121, an organic EL element 4 as a subject for detection is designated.

Figure 9:
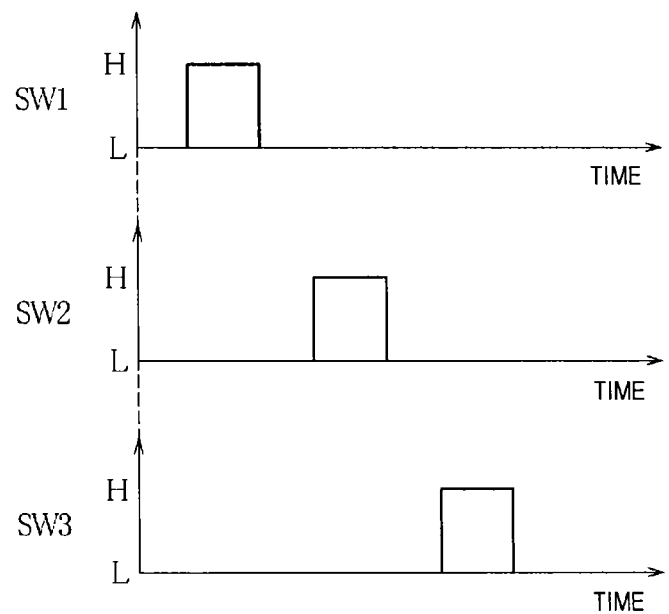
FIG. 9 is a timing chart showing an example of a control signal which is applied to each switch in the circuit configuration of FIG. 4.

Specifically, FIG. 9 is an example of a timing chart of a control signal which is applied to the switches SW1 to SWn in the electrical circuit diagram of FIG. 5. As shown in FIG. 9, the control signal is a pulse voltage, and the pulse voltage is applied sequentially to the switches SW1 to SWn with shift of a predetermined time each time the first malfunction determination of Step S12 is performed, and a switch SWi to which the pulse voltage is applied is closed. If the switch SWi is closed, an organic EL element 4 as a subject for detection is selected, and a current flows in the selected organic EL element 4. Accordingly, voltage measurement for the organic EL element 4 connected to the switch SWi is possible.

Subsequently, in Step S122, a subject for voltage detection is switched to the selected organic EL element 4 in accordance with the connection of the switch SWi, and the voltage Vi of the organic EL element 4 as a subject for detection is measured (measurement step). The measured voltage Vi of the organic EL element 4 is A/D converted by the A/D converter 20 and input to the processor 10.

In Step S123, a reference voltage range which corresponds to the current value flowing in the organic EL element 4 as a subject for detection and is used in malfunction determination is read from a reference voltage range map which is registered in the memory 26 in advance. As described above, since the organic EL element 4 as a subject for detection is driven with a predetermined constant current, the current value becomes a default value.

Figure 10:
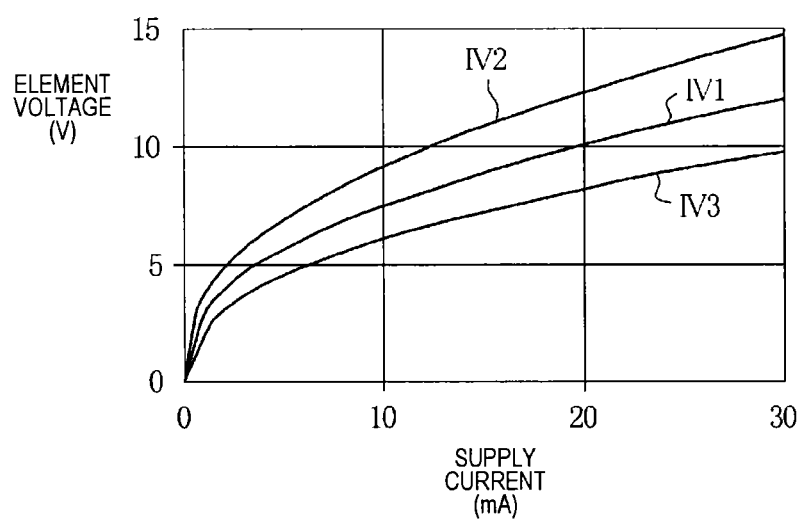
FIG. 10 is a graph showing an example of the relationship between an element voltage and a supply current as the basis of a reference voltage range map to be used in the first malfunction determination routine.

FIG. 10 is an example of a graph which shows the relationship between a voltage and a current of an organic EL element 4 as the basis of the reference voltage range map in Step S123. The graph includes a characteristic curve IV1 which represents the standard current-voltage characteristic in the organic EL element 4, a characteristic curve IV2 which represents the upper limit of an electrical characteristic due to manufacturing variation of the organic EL element 4, and a characteristic curve IV3 which represents the lower limit of an electrical characteristic due to manufacturing variation of the organic EL element 4. The voltage range between the characteristic curves IV2 and IV3 with a certain current value is obtained by adding an individual difference in the electrical characteristic of the organic EL elements 4 to the standard voltage value on the characteristic curve IV1 corresponding to the current value. In the reference voltage range map in Step S123, the voltage range defined by the characteristic curve IV2 and the characteristic curve IV3 when the current flowing in the organic EL element 4 changes in various ways based on the characteristic curves is defined as the reference voltage range.

In Step S124, the temperature Ti of the organic EL element 4 as a subject for detection is detected by the temperature sensor 22, A/D converted by the A/D converter 24, and input to the processor 10. The processor 10 obtains a temperature compensation factor corresponding to the detected temperature Ti using a temperature compensation factor map which is registered in the memory 26 in advance.

Figure 11:
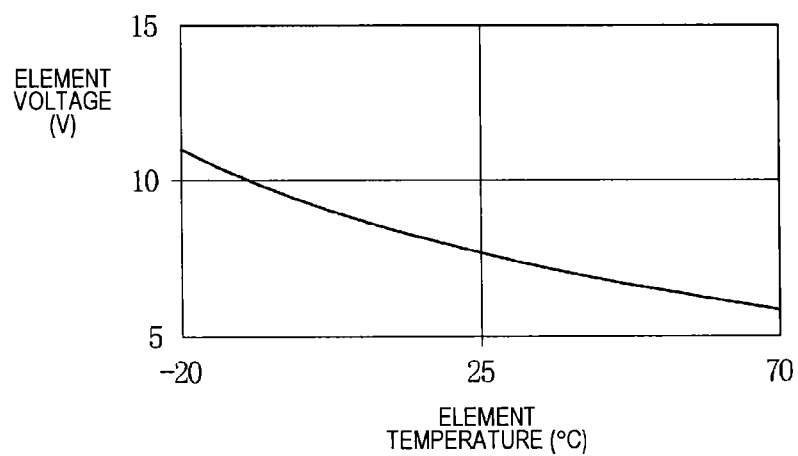
FIG. 11 is a graph showing an example of the relationship between an element voltage and an element temperature as the basis of a temperature compensation factor map to be used in the first malfunction determination routine.

Description will be specifically provided with reference to FIGS. 10 and 11. FIG. 11 is an example of a graph which shows the relationship between an element voltage and an element temperature as the basis of the temperature compensation factor map in Step S124. The element temperature is the surface temperature of the organic EL element 4. In the example of FIG. 11, the current flowing in the organic EL element 4 is 10 mA. As shown in FIG. 11, since the element voltage of the organic EL element 4 changes depending on the element temperature, the element voltage of the organic EL element 4 may be different from the voltage value at 10 mA of the standard characteristic curve IV1 shown in FIG. 10. For this reason, it is necessary to obtain a temperature compensation factor for compensating for this difference. Accordingly, in regard to the temperature compensation factor, for example, if the standard element voltage when the element temperature of the organic EL element 4 is 25° C. with a drive current of 10 mA is 7.5 V from the relationship of FIG. 10, when the element temperature is changed to 70° C., the element voltage measured from the relationship of FIG. 11 becomes 6.0 V. Therefore, the temperature compensation factor becomes 6.0/7.5=0.8. In this way, the temperature compensation factor is calculated for each element temperature, and registered as a temperature compensation factor map in the memory 26 in advance. In Step S124, the temperature compensation factor is obtained from the temperature compensation factor map registered in the memory 26.

The processor 10 calculates the turn-on time in each organic EL element 4, and in Step S125, acquires the integrated time of the turn-on time in the organic EL element 4 as a subject for detection from the processor 10. In regard to the acquired integrated time of the turn-on time, a time-dependent compensation factor is obtained from a time-dependent compensation factor map for the integrated time of the turn-on time which is registered in the memory 26 in advance. The time-dependent compensation factor includes compensation corresponding to the integrated time of the turn-on time and compensation corresponding to a predetermined period from the initial power activation.

Figure 12:
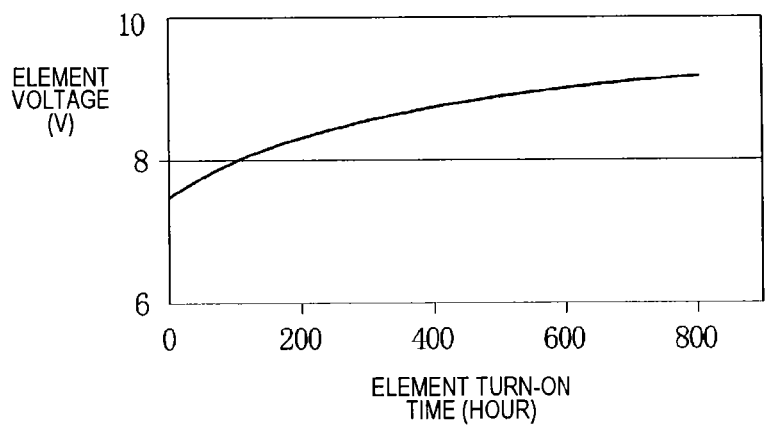
FIG. 12 is a graph showing an example of the relationship between an element voltage and an element turn-on time as the basis of a time-dependent compensation factor map of an organic EL element to be used in the first malfunction determination routine.
Figure 13:
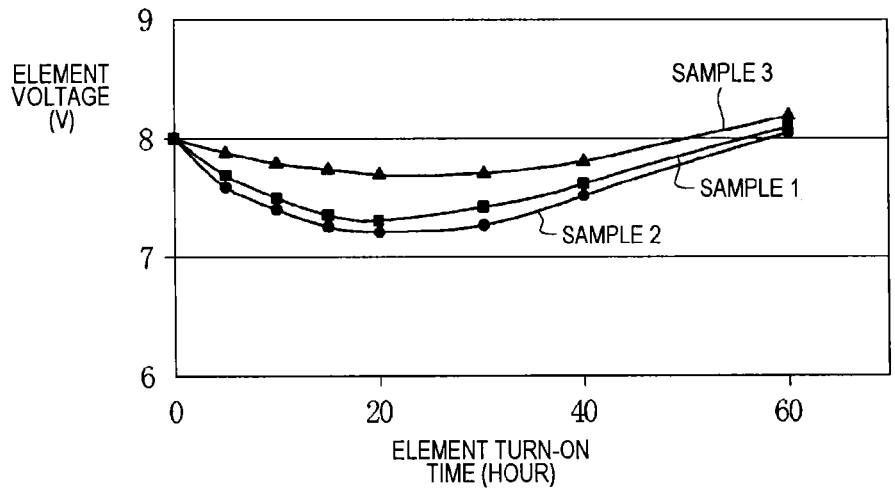
FIG. 13 is a graph showing an example of the relationship between an element voltage and an integrated time of an element turn-on time as the basis of a time-dependent compensation factor map to be used in the first malfunction determination routine.

The time-dependent compensation factor will be described in detail with reference to FIGS. 10, 12, and 13. FIG. 12 is a graph showing an example of the relationship of an element voltage and an element turn-on time as the basis of compensation for time-dependent change corresponding to the integrated time of the turn-on time in Step S125, and represents time-dependent change in an element voltage when the organic EL element 4 is driven with a drive current of 10 mA. As shown in FIG. 12, as the integrated time of the turn-on time of the organic EL element 4 increases, the element voltage tends to increase due to a non-conduction malfunction of the organic EL element 4.

Accordingly, in regard to the time-dependent compensation factor, for example, when the standard element voltage when the integrated time of the turn-on time of the organic EL element 4 is 0 hour with a drive current of 10 mA is 7.5 V, if the integrated time of the turn-on time reaches 600 hours, the element voltage becomes 9.0 V. A time-dependent compensation factor Ct in this case becomes 9.0/7.5=1.2.

At the time of the initial power activation, in particular, since the current-voltage characteristic of the organic EL element 4 is unstable, it is necessary to take into consideration initial variation in the characteristic. FIG. 13 is a graph showing an example of the relationship between an element voltage and an integrated time of an element turn-on time as the basis of a time-dependent change compensation factor map in Step S125. In the example of FIG. 13, three organic EL elements 4 are selected as a sample, and initial variation in the element voltage when each of the selected organic EL elements 4 is driven with a drive current of 10 mA is shown. As shown in FIG. 13, the element voltage has a tendency that the voltage value falls after peaking around 20 hours from power activation to the organic EL element 4, and returns to the voltage value at the time of power activation when 40 hours or more elapse. The phenomenon in which the element voltage falls after peaking around 20 hours occurs because a current which does not contribute to turn-on flows due to an impurity in the organic EL element 4 at the time of electrification and a leak current increases.

Accordingly, the time-dependent compensation factor includes correction of the initial variation characteristic. Initial variation is related to the occurrence of initial defect. In particular, in the case of an organic EL element, if the turn-on time is short, migration occurs between the layers constituting the organic EL element, and the current tends to easily flow. However, this is stable when the integrated time of the turn-on time is around 40 hours, and the tendency is eliminated. As the initial variation characteristic, for example, if the standard voltage when the integrated time of the turn-on time of the organic EL element 4 is 0 hour with a drive current of 10 mA is 7.5 V, the element voltage when the integrated time of the turn-on time is 20 hours can be regarded as the average value of the element voltages of the three organic EL elements 4 and thus becomes 7.4 V. Therefore, the time-dependent compensation factor in this case becomes Ct×7.4/7.5≅0.987Ct. In this way, the time-dependent compensation factor including compensation for initial variation is calculated for each integrated time, and registered as a time-dependent compensation factor map in the memory 26 in advance. In Step S125, a time-dependent compensation factor is obtained from the time-dependent compensation factor map registered in the memory 26.

Subsequently, in Step S126, the temperature compensation factor and the time-dependent compensation factor obtained in Steps S124 and S125 are multiplied to the reference voltage range read in Step S123 to obtain reference voltage ranges Vmin to Vmax in which the temperature characteristic of the organic EL element 4 and the voltage change characteristic and initial variation to the integrated time of the turn-on time are reflected (reference range setting step). It is preferable that the reference voltage ranges Vmin to Vmax differ depending on the emission color of the organic EL element 4. Accordingly, even when there is a difference in the electrical characteristic of the organic EL elements 4 with different emission colors, it becomes possible to more accurately detect malfunctions of the organic EL elements 4.

With the correction of the reference voltage ranges, even when there is an influence of the use condition of the organic EL element 4 or ambient environment, it is possible to accurately malfunctions of the organic EL elements 4 and to improve malfunction detection accuracy. In particular, since initial variation of the organic EL element 4 is liable to occur within 40 hours from the initial use, the reference voltage ranges are corrected around 40 hours, thereby improving malfunction detection accuracy. Since the reference voltage ranges Vmin to Vmax are set to include the individual difference in the electrical characteristic of the current-voltage characteristics of the organic EL elements 4 shown in FIG. 10, even when there is variation in the electrical characteristic of the organic EL elements 4 at the time of manufacturing, it is possible to accurately detect a malfunction.

In Step S127, it is determined whether or not the voltage Vi measured in Step S122 is within the reference voltage ranges Vmin to Vmax corrected in Step S126 (first malfunction determination step). When the determination is true (Yes), it is determined in Step S128 to be normal, the first malfunction determination routine ends, and the process progresses to Step S13. When the determination result is false (No), the process progresses to Step S129.

In Step S129, it is determined whether or not the voltage Vi measured in Step S122 is smaller than a lower limit value Vmin of the reference voltage range corrected in Step S126. When the determination result is true (Yes), it is determined in Step S130 to be a short-circuit malfunction. When the determination result is false (No), it is determined in Step S131 to be a non-conduction malfunction (for example, disconnection, charge storage, or the like), the first malfunction determination routine ends, and the process progresses to Step S13. Accordingly, it is possible to more accurately recognize a malfunction state.

Returning to FIG. 7, in Step S13, it is determined whether or not the organic EL element 4 as a subject for detection in the first malfunction determination routine of Step S12 is normal. When the determination result is false (No), the process progresses to Step S14. When the determination result is true (Yes), the process progresses to Step S19.

In Step S14, it is determined whether or not the determination result of Step S12 is a short-circuit malfunction. When the determination result is true (Yes), the process progresses to Step S15.

Figure 14:
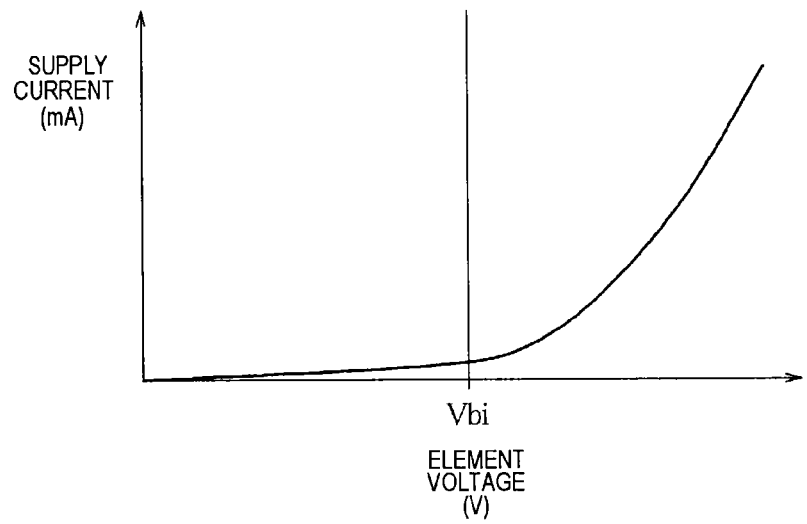
FIG. 14 is a graph showing an example of voltage-current characteristics when a voltage is applied to a normal organic EL element.

In Step S15, second malfunction determination is performed for the organic EL element 4 as a subject for detection. FIG. 14 is a graph when a voltage is applied to the normal organic EL elements. The graph shown in FIG. 14 is expressed by the approximation of the V-I characteristics of the normal organic EL elements. Specifically, it is assumed that, when the voltage across the organic EL element be Vd, the current flowing in the organic EL element be Id, A and R be constants, and e be an elementary charge, a built-in potential Vbi is obtained by Vbi=(φp−φn)/e based on the difference between the work function φp of the electrode material of the positive electrode and the work function φn of the electrode material of the negative electrode constituting the organic EL element. On this assumption, the current flowing in the organic EL element is expressed by Id≅Vd/R when Vd≤Vbi, and is expressed by Id≅Vd/R+A·(Vd−Vbi)² when Vd>Vbi.

In regard to the characteristic of FIG. 14, while in the above-described approximation, accuracy is slightly lowered around the built-in potential Vbi, the characteristic matches the characteristic of the organic EL element. For example, the work function of the electrode material used in the positive electrode is 4.8 eV when ITO is used, and 5.1 eV when IZO (indium zinc oxide) is used. The work function of the electrode material for the negative electrode is 3.0 eV when Ca is used, 3.7 eV when Mg is used as Mg—Ag alloy, and 2.9 eV when Li is used as Al—Li alloy. Accordingly, the built-in potential Vbi calculated from the work functions of the electrode materials actually used in the organic EL element is in a range of approximately 1.1 to 2.2 V.

Figure 15:
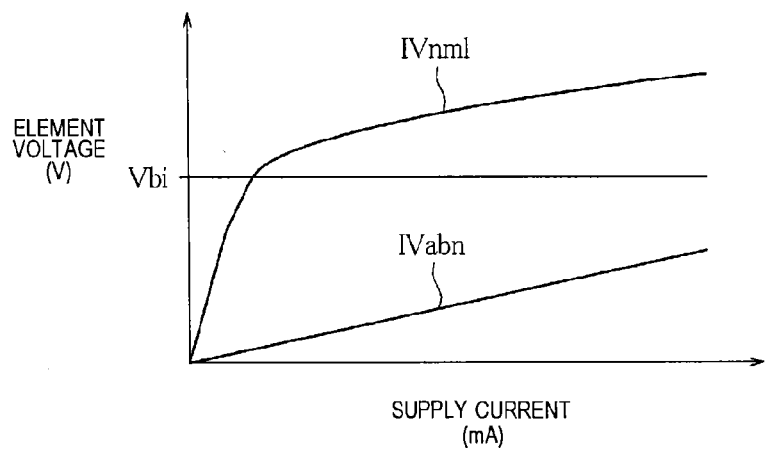
FIG. 15 is a graph showing an example of current-voltage characteristics of a normal organic EL element and an organic EL element with a short-circuit malfunction.

In the organic EL element, if energy greater than the difference in the work function between the positive and negative electrodes constituting the organic EL element is applied, the movement of electric charges which can be initially turned on starts, and an increase in the voltage to be applied and a large flow of electric charges occur. The operation resistance at this time is substantially constant with no voltage dependency in the range of the element voltage from 0 to Vbi. In a voltage area higher than the built-in potential Vbi, the current flowing in the organic EL element rapidly increases with the characteristic of the square of (Vd–Vbi) with respect to the element voltage Vd. FIG. 15 is an example of a graph in which the relationship between an element voltage Vd and a supply current Id shown in FIG. 14 is represented by the I-V characteristic. A curve IVnml is the I-V characteristic of a normal organic EL element, and a line IVabn is the I-V characteristic of an organic EL element with a short-circuit malfunction.

When the second malfunction determination is made with constant current driving, as shown in FIG. 15, a difference in the voltage of the organic EL element 4 between normal and a short-circuit malfunction increases. For this reason, a current flowing in the organic EL element 4 may be the current value when the voltage applied across the normal organic EL element 4 becomes the built-in potential Vbi obtained from the work functions of the positive and negative electrodes. Meanwhile, in order to accurately determine whether or not the organic EL element 4 is normal, a current value corresponding to the voltage value slightly higher than the built-in potential Vbi may flow. Specifically, it is preferable that a current supplied to the organic EL element 4 is equal to or greater than 1 times and equal to or smaller than 1.8 times the standard current flowing when the voltage applied to the organic EL element 4 becomes equal to the built-in potential Vbi, or equal to or greater than 1.2 time and equal to or smaller than 1.8 times so as to allow a margin of a current value or accuracy of a detection circuit. If this is calculated from the built-in potential Vbi, the voltage applied to the organic EL element 4 in the second malfunction determination is in a range of 1.1 to 4 V.

While the reference voltage which is used in the second malfunction determination with constant current driving is the voltage equal to or smaller than the built-in potential Vbi, it is preferable that the voltage value is lower than the built-in potential Vbi so as to accurately determine the normal organic EL elements 4. The voltage value higher than the built-in potential Vbi may be used so as to accurately determine the organic EL element 4 with a short-circuit malfunction. Meanwhile, since a current to be supplied during constant current driving is in a current area where a difference in the characteristic between the organic EL element 4 with a short-circuit malfunction and the normal organic EL element 4 increases, the reference voltage may fall to half of the built-in potential Vbi. That is, the reference voltage preferably has the voltage value 0.5 times to 1 times the built-in potential Vbi. Accordingly, it becomes possible make determination with high accuracy using a simple circuit in which detection with a high determination voltage is not required.

The second malfunction determination of Step S15 may be performed with constant voltage driving such that the organic EL element 4 as a subject for detection is turned off, or may be performed with the application of a reverse voltage. At this time, the processor 10 falls the output voltage of the power supply circuit 14 to a predetermined constant value at which the organic EL element 4 is not turned on, bypasses the constant current source circuit CAj provided corresponding to the organic EL element 4 as a subject for detection, and performs constant voltage driving in which the organic EL element 4 is turned off. It is preferable that the predetermined voltage value at this time is about 0.1 to 4 V at which the difference in the characteristic between a short-circuit malfunction and a non-short-circuit malfunction of the organic EL element 4 becomes clear.

A case where the second malfunction determination is performed with constant voltage driving will be described below. While the voltage applied to the organic EL element 4 is preferably the built-in potential Vbi at which malfunction determination is easily made, the voltage may be lower than the built-in potential Vbi taking into consideration manufacturing variation in the organic EL element 4. However, since a circuit configuration in which a current close to the turn-on of the organic EL element 4 flows easily performs malfunction determination taking into consideration ease of circuit design, the voltage to be applied may be high. Accordingly, it is preferable that the voltage value applied to the organic EL element 4 is 0.7 to 1.0 times the built-in potential Vbi. It is preferable that a reference current value Ib in this case is 1.5 to 8 times the standard current flowing when a voltage equal to the built-in potential Vbi is applied on the condition that the organic EL element 4 is normal. More preferably, the reference current value is 2 to 4 times the standard current. When the measured value of the organic EL element 4 is equal to or smaller than the reference current value Ib, it is determined that the organic EL element 4 is normal.

Figure 16:
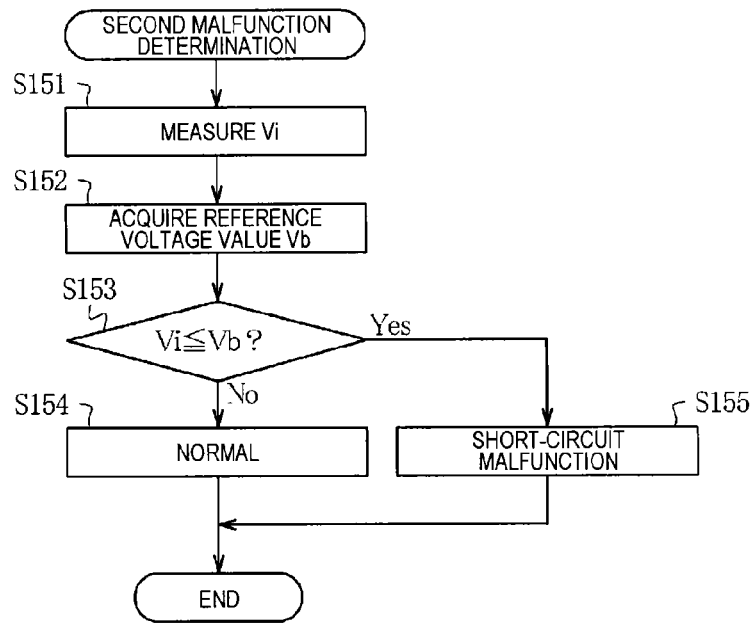
FIG. 16 is a flowchart showing a second malfunction determination routine which is performed in the malfunction detection routine shown in FIG. 7.

In this example, as described above, constant current driving is used, and the second malfunction determination of Step S15 will be specifically described from a flowchart of a second malfunction determination routine of FIG. 16. In Step S151, the voltage Vi applied to the organic EL element 4 as a subject for detection designated in Step S121 is measured, A/D converted by the A/D converter 20, and input to the processor 10 (measurement step).

In Step S152, a reference voltage value Vb corresponding to a current supplied to the organic EL element 4 as a subject for detection is read from the memory 26 in advance (reference range setting step). As described above, since the organic EL element 4 as a subject for detection is driven with a predetermined constant current, the current value becomes a default value.

In Step S153, it is determined that the voltage Vi measured in Step S151 is equal to or smaller than the reference voltage value Vb read in Step S152 (second malfunction determination step). When the determination result is true (Yes), in Step S154, it is determined to be normal. When the determination result is false (No), in Step S155, it is determined to be a short-circuit malfunction, the second malfunction determination routine ends, and the process progresses to Step S16. Accordingly, it is possible to more clearly discriminate whether or not a malfunction occurs from the condition that a large current flows when there is a short-circuited area, thereby improving the detection accuracy of a short-circuit malfunction. The organic EL element 4 which is determined to be a short-circuit malfunction from the value of the voltage Vi measured when the organic EL element 4 as a subject for malfunction detection is driven to be turned on is regarded as a subject, and determination of a short-circuit malfunction is performed with higher accuracy from the value of the voltage Vi measured when the organic EL element 4 is driven to be turned off, thereby performing detection with high accuracy while efficiently advancing malfunction determination.

Returning to FIG. 7, in Step S16, it is determined whether or not a short-circuit malfunction is detected in Step S15. When the determination result is true (Yes), the process progresses to Step S17. When the determination result is false (No), the process progresses to Step S19.

(Restoration of Short-Circuit Malfunction of Organic EL Element)

Figure 17:
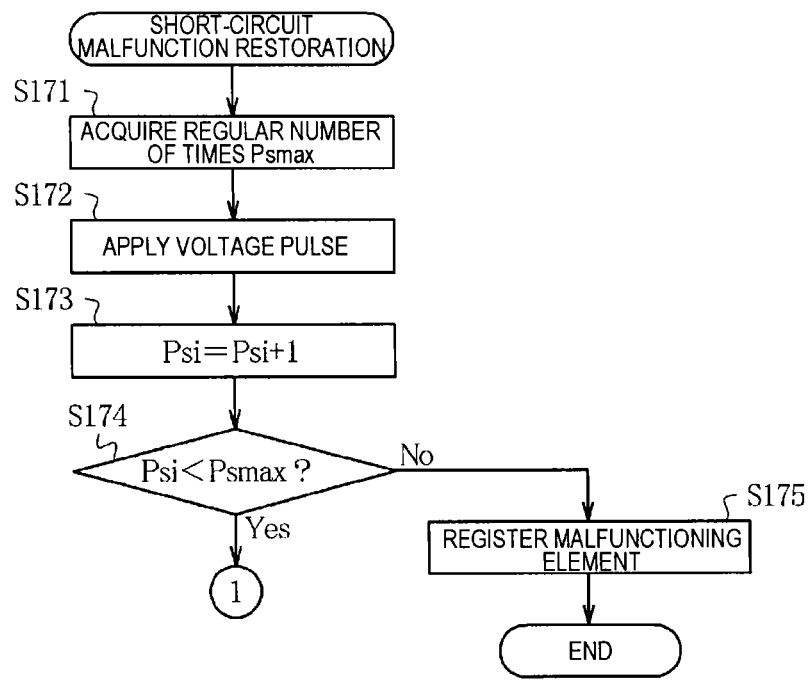
FIG. 17 is a flowchart showing a short-circuit malfunction restoration routine which is performed in the malfunction detection routine shown in FIG. 7.

In Step S17, restoration of a short-circuit malfunction area is performed for the organic EL element 4 as a subject for detection which is determined to be a short-circuit malfunction (short-circuit malfunction restoration step). In the short-circuit malfunction restoration, a pulsed voltage is applied to the organic EL element 4, which is determined to be a short-circuit malfunction in Step S16, to restore a short-circuited area. Specifically, description will be provided from a flowchart of a short-circuit malfunction restoration routine shown in FIG. 17.

In Step S171, a prescribed number of times (a predetermined number of times) Psmax of voltage pulse application registered in the memory 26 in advance is read. While it is preferable that a voltage pulse is applied a number of times until a short-circuited area is disconnected so as to reliably disconnect a short-circuited area, malfunction restoration noticeably increases with an increase in the number of applications. For this reason, it is preferable that the number of applications is small so as to prevent a non-conduction malfunction of the normal organic EL element 4. Accordingly, the prescribed number of times Psmax is preferably equal to or greater than two and equal to or smaller than ten.

In Step S172, a voltage pulse with a predetermined pulse width is applied to an organic EL element 4 as a subject for restoration to disconnect a short-circuited area. Accordingly, the organic EL element 4 as a subject for restoration can be restored. While it is preferable that the voltage pulse applied to a short-circuited area is at a high voltage so as to reliably disconnect a short-circuited area, since a non-conduction malfunction of the organic EL element 4 is likely to occur with the application of the voltage pulse, the voltage pulse is preferably at a low voltage. Specifically, for example, a reverse voltage pulse equal to or greater than 10 V and equal to or smaller than 50 V is preferably used. More preferably, a reverse voltage pulse equal to or greater than 12 V and equal to or smaller than 30 V is used. With the application of the reverse voltage pulse, since the organic EL element 4 as a subject for restoration can be restored while remaining turned off, it becomes possible to perform restoration less noticeably while eliminating unnecessary turn-on accompanied by restoration.

A forward overvoltage pulse which is greater than the voltage for driving the organic EL element 4 to be turned on, for example, equal to or greater than 8 V and equal to or smaller than 20 V, and preferably, equal to or greater than 10 V and equal to or smaller than 16 V, or an overcurrent pulse which is greater than the current for driving the organic EL element 4 to be turned on, for example, equal to or greater than 3 times and equal to or smaller than 20 times the current during normal turn-on may be used. When an overcurrent pulse flows in a short-circuited area, it is preferable that the magnitude of the overcurrent pulse is large so as to reliably disconnect a short-circuited area. Meanwhile, since a non-conduction malfunction of the organic EL element 4 is likely to occur due to the overcurrent pulse, the overcurrent pulse preferably has a small current value.

When a forward overvoltage pulse is applied, it is preferable that the magnitude of the overvoltage pulse is high so as to reliably disconnect a short-circuited area. Meanwhile, since a non-conduction malfunction of the organic EL element 4 occurs, the overvoltage pulse is preferably at a low voltage. When a forward voltage increases compared to normal turn-on and an overvoltage pulse is applied, since the turn-on current of the normal organic EL element 4 rapidly increases, the heat generation of the organic EL element 4 increases and a short-circuited area is easily disconnected. Meanwhile, since the temperature of the organic EL element 4 increases, a non-conduction malfunction occurs. Accordingly, a short pulse is used to disconnect a short-circuited area. The application time of the overvoltage pulse is sufficiently long so as to obtain the temperature of the organic EL element 4 necessary for disconnection because a short-circuited area is disconnected by heat generation obtained when electric charges are stored in a capacitor of the organic EL element 4. Meanwhile, if the temperature of the entire organic EL element 4 excessively increases, since a non-conduction malfunction of the organic EL element 4 is liable to occur, the application time is preferably short. As the voltage to be applied is high, the application time may be short. Specifically, it is preferable that the application time is equal to or greater than 0.5 ms and equal to or smaller than 500 ms. With this pulse, it is possible to disconnect a short-circuited area. Subsequently, in Step S173, the number of applications Psi of the voltage pulse is incremented.

In Step S174, it is determined whether or not the number of applications Psi of the voltage pulse incremented in Step S173 is smaller than a prescribed number of times Psmax read in Step S171. When the determination result is true (Yes), the short-circuit malfunction restoration routine ends, the process returns to Step S15, and the second malfunction determination routine is executed. In the second malfunction determination routine, since the second malfunction determination is performed again, it is possible to accurately determine whether or not a short-circuited area is disconnectable by the voltage pulse applied to the organic EL element 4 as a subject for restoration in Step S172.

When the process returns from Step S174 to Step S15 shown in FIG. 7, the second malfunction determination routine is executed, and it is still determined that a short-circuited area is not restored, the short-circuit malfunction restoration routine of Step S17 is executed again to restore a short-circuited area. In this way, short-circuited area restoration and short-circuited area restoration determination are repeatedly performed until the prescribed number of times Psmax is reached, making it possible to more reliably restore a short-circuited area. Since the same determination as when it is determined to be a short-circuit malfunction is made, it is possible to more reliably determine whether or not a short-circuit malfunction area is restored.

When it is determined in Step S174 to be false (No), the process progresses to Step S175. In Step S175, if a short-circuited area is not restorable even when the number of applications of the pulse reaches the prescribed number of times Psmax, it is determined that the organic EL element 4 as a subject for restoration is a hard-to-restore element, element information (individual information) including identification information is registered in the memory 26, the short-circuit malfunction restoration routine ends, and the process progresses to Step S19. Therefore, it is possible to clearly discriminate a malfunctioning element.

In this way, if the second malfunction determination is performed after it is determined to be a short-circuit malfunction with the first malfunction determination, and the determination of a short-circuit malfunction with the malfunction determination and the short-circuit malfunction restoration after it is determined to be a malfunction are performed, it is possible to more reliably an organic EL element with a short-circuit malfunction.

(Turn-On Control of Illumination Apparatus)

Next, in Step S2 shown in FIG. 6, all the switches SW of the element switching circuits 8 corresponding to the normal organic EL elements 4 are placed in the ON state based on the malfunction detection result in Step S1, and turn-on control is performed (turn-on control step). The turn-on control is performed in accordance with a flowchart of a turn-on control routine of FIG. 18. Hereinafter, description will be provided in accordance with the flowchart with reference to the drawings.

In Step S21, malfunctioning element information registered in the memory 26 in at least one of Steps S175 and S185 is read. The malfunctioning element information includes positional information of an organic EL element 4 which is determined to be a malfunction.

In Step S22, it is determined whether or not a turn-on mode is ON. The turn-on mode may be the state where a switch (not shown) for start/stop switching of the illumination apparatus 1 is ON, or may be the state where a signal for turning on the illumination apparatus 1 is input to the processor 10 by other methods. When the determination result is true (Yes), the process progresses to Step S23. When the determination result is false (No), it is determined that the turn-on mode is OFF, and the turn-on control routine ends. Although the determination of the turn-on mode is performed in Step S22, when the turn-on mode is OFF during Steps S23 to S25 described below, it is assumed that the turn-on control routine ends at this time. Accordingly, when the turn-on mode is OFF, the malfunction detection of Step S1 is repeated until the turn-on mode is ON.

In Steps S23 to S25 described below, a current-luminance characteristic map which defines the luminance of the organic EL element 4 for the current value of the organic EL element 4 registered in the memory 26 in advance so as to perform the turn-on control, a heat generation parameter which defines a surface temperature for the current value of the organic EL element 4 or the product of the voltage value and the current value, characteristic balance data of each emission color which defines the luminance of each organic EL element 4 for the emission color of the organic EL light-emitting panel 2, a maximum current value which can flow in the organic EL element 4, a visibility correction map for the emission luminance of the organic EL element 4, and the like are used.

Figure 19:
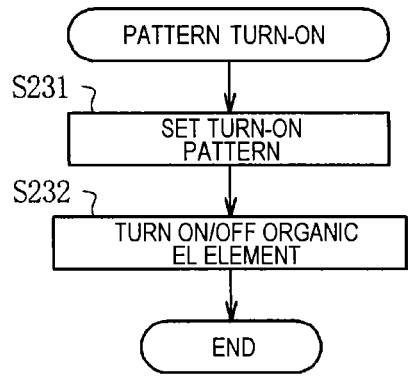
FIG. 19 is a flowchart showing a pattern turn-on routine which is performed in the turn-on control routine shown in FIG. 18.

In Step S23, pattern turn-on is performed for each divided emission area. In Step S23, it is preferable that the switch SW of the element switching circuit 8 corresponding to the organic EL element 4 determined to be a malfunction from the malfunctioning element information read in Step S21 is turned off to stop power feed. With the stop of power feed, it is possible to stop a wasteful current supply and to prevent the occurrence of an additional malfunction of the organic EL element 4 determined to be a malfunction or a non-conduction malfunction. Specifically, description will be provided from a flowchart of a pattern turn-on routine shown in FIG. 19.

In Step S231, positional information of the malfunctioning organic EL elements 4 is acquired from the malfunctioning element information read in Step S21 to obtain the state of distribution of the malfunctioning organic EL elements 4, the turn-on pattern such that the organic EL light-emitting panel 2 has a regular turn-on pattern as a whole using only the normal organic EL elements 4 while the malfunctioning organic EL elements 4 are turned off is obtained for each emission area using a malfunctioning element distribution map, voltage parameters, current parameters, or temperature parameters obtained using the current parameters.

In Step S232, in order to form the turn-on pattern obtained in Step S231, the normal organic EL elements 4 of each emission area are turned on/off to form the turn-on pattern obtained in Step S231, the pattern turn-on routine ends, and the process returns to Step S22. The turn-on pattern may be changed each time Step S23 is repeated. Accordingly, it is possible to reduce a deviation in the heat generation of the organic EL elements 4 of each emission area is reduced to prevent a non-conduction malfunction, thereby extending the element lifetime.

Figure 20A:
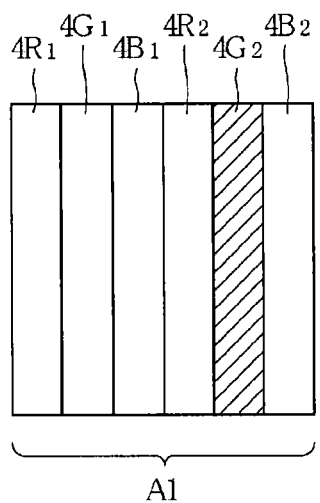
FIG. 20(A) is a plan view schematically showing an example of a malfunction pattern in a predetermined emission area including a malfunctioning organic EL element.
Figure 20B:
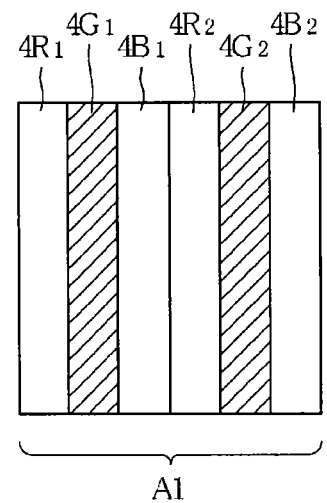
FIG. 20(B) is a plan view schematically showing an example of a predetermined emission area when a pattern turn-on routine is executed.

FIGS. 20(A) and 20(B) show an example of the turn-on control based on the pattern turn-on routine. FIG. 20(A) shows an example of a malfunction pattern of one emission area when the pattern turn-on routine is not executed. When an organic EL element $4G_2$ with a green emission color in the emission area A1 malfunctions and is turned off, a black line is put in the emission area A1 when the organic EL light-emitting panel 2 is viewed and the appearance is bad. Furthermore, combined light obtained by combining light of the organic EL elements 4 in the emission area A1 does not become white, and a deviation in the color of illumination light occurs. If the pattern turn-on routine is executed, as shown in FIG. 20(B), an organic EL element $4G_1$ with the same emission color as the malfunctioning organic EL element $4G_2$ is intentionally turned off. If this turn-on pattern is made in all of the emission areas A1 to Ak, a predetermined regular turn-on pattern is formed in each organic EL light-emitting panel 2. When control is performed with pattern turn-on, while the color of illumination light of the illumination apparatus 1 does not partially become white, a deviation in the color of illumination light as a decorative illumination is eliminated and the appearance is improved without causing a sense of discomfort. It is also possible to maintain the quality of illumination light of the illumination apparatus 1.

Figure 18:
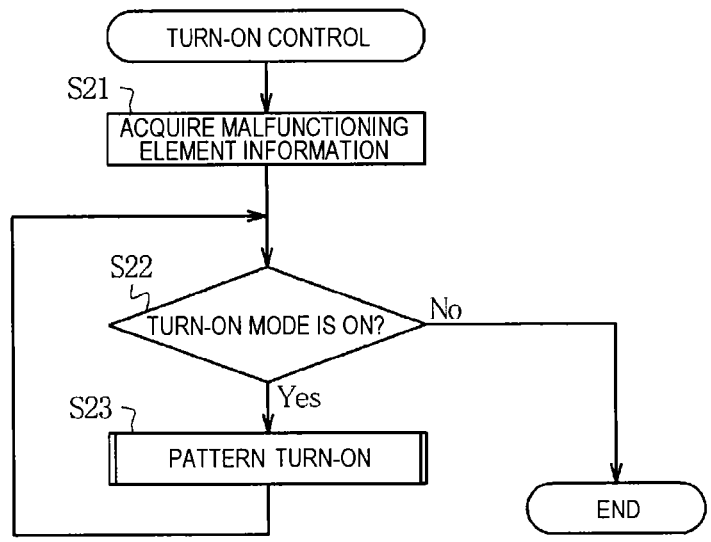
FIG. 18 is a flowchart showing a turn-on control routine in a method of controlling an illumination apparatus.
Figure 21:
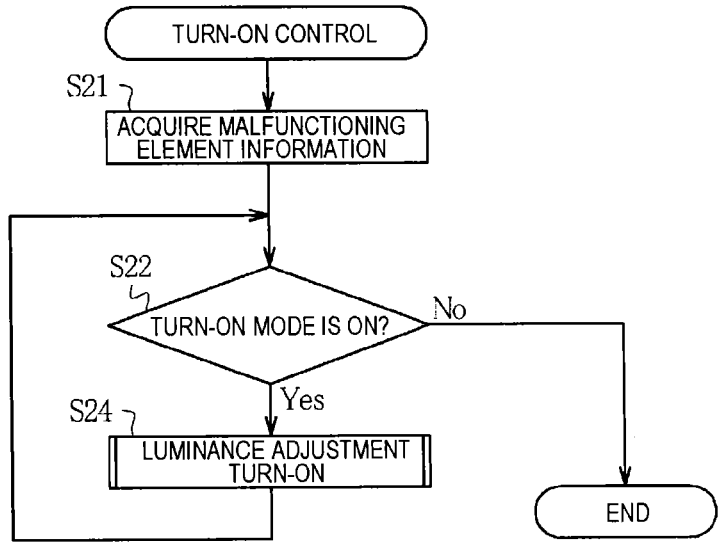
FIG. 21 is a flowchart showing a modification of a turn-on control routine in the method of controlling an illumination apparatus.

Instead of the pattern turn-on routine, as a modification of the turn-on control, luminance adjustment turn-on may be performed based on a turn-on control routine in a flowchart of FIG. 21 such that the luminance of the light-emitting surface is substantially uniform for each emission area. In the flowchart of FIG. 21, the pattern turn-on routine of Step S23 in the flowchart of FIG. 18 is replaced with a luminance adjustment turn-on routine of Step S24. Step S24 will be specifically described below from a flowchart of a luminance adjustment turn-on routine shown in FIG. 22.

In Step S241, positional information of the malfunctioning organic EL elements 4 is acquired from the malfunctioning element information read in Step S21 to obtain the state of distribution of the malfunctioning organic EL elements 4, and using the current-luminance characteristic map or a visibility correction map for emission luminance, the luminance of the same emission color as the malfunctioning organic EL element 4 in the emission area including the malfunctioning organic EL element 4 increases to bring the color of combined light obtained in the emission area close to the color of combined color obtained in a different emission area, and the luminance of an emission color different from the malfunctioning organic EL element 4 in the same predetermined area decreases to eliminate irregularity in luminance, such that the luminance of the entire illumination apparatus 1 is averaged. At this time, for the luminance adjustment, variation in the current is obtained from the current-luminance characteristic map, the variation in the current is corrected using the visibility correction map, and an instruction is sent from the processor 10 to the corresponding constant current source circuit.

In Step S242, the current of each of the normal organic EL elements 4 of the emission area is adjusted from the variation in the current obtained in Step S241, and the luminance adjustment turn-on routine ends. Each time the luminance adjustment turn-on routine is repeatedly executed, the luminance adjustment amount may be changed at a predetermined time interval. Accordingly, it is possible to reduce a deviation in the heat generation of the entire organic EL light-emitting panel 2 to prevent a non-conduction malfunction, thereby extending the element lifetime.

Figure 23A:
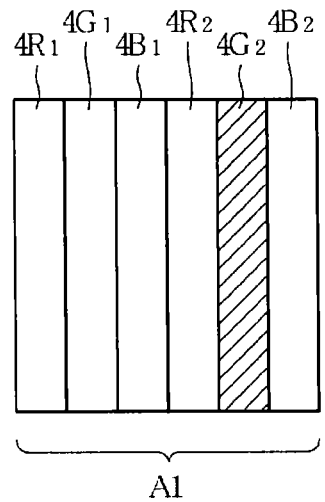
FIG. 23(A) is a plan view schematically showing an example of a malfunction pattern in a predetermined area of a light-emitting surface including a malfunctioning organic EL element.
Figure 23B:
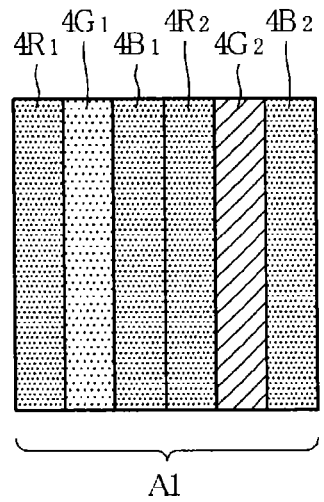
FIG. 23(B) is a plan view schematically showing an example where control is performed with luminance adjustment turn-on in FIG. 23(A).

FIGS. 23(A) and 23(B) show an example of the turn-on control based on the luminance adjustment turn-on routine. FIG. 23(A) shows an example of a malfunctioning pattern of one emission area when the luminance adjustment turn-on routine is not executed. When an organic EL element $4G_2$ with a green emission color in the emission area A1 malfunctions and is turned off, as in FIG. 20(A), color irregularity is locally observed. When this is controlled with luminance adjustment turn-on, as shown in FIG. 23(B), the luminance of the organic EL element $4G_1$ with the same color as the malfunctioning organic EL element $4G_2$ in the emission area A1 increases by the amount of increase in luminance obtained in Step S241. With the luminance adjustment, since the luminance of the emission area A1 increases, the luminance of each of the organic EL elements $4R_1$, $4R_2$, $4B_1$, and $4B_2$ with an emission color different from the malfunctioning organic EL element $4G_2$ decreases by the amount of decrease in luminance obtained in Step S241 to compensate for the increase in luminance of the emission area A1. When the luminance adjustment turn-on routine is executed, if the luminance of each of the normal organic EL elements $4R_1$, $4R_2$, $4G_1$, $4B_1$, and $4B_2$ around the malfunctioning organic EL element $4G_2$ is adjusted, while color irregularity occurs in a local portion of the light-emitting surface 7 including the malfunctioning element, the luminance of combined light as the whole of the emission area A1 is substantially averaged.

In the luminance adjustment turn-on, control is performed such that a deviation in luminance in the area of a ⅕ angle of the minor axis of the organic EL element is within 15%. The minor axis represents the length in the lateral direction when the organic EL element has a rectangular shape, the diameter when the organic EL element has a circular shape, and the minor axis when the organic EL element has an elliptical shape. In order to adjust the luminance of the organic EL element for each emission color, control is performed such that a color difference in the area of a ⅕ angle of the minor axis of the organic EL element falls within MacAdam 3Step with respect to the standard value. The luminance adjustment turn-on is not limited thereto, and for example, the luminance of a normal element may have a gradient depending on the distance from a malfunctioning element. Specifically, control may be performed such that a normal element close to a malfunctioning element has low luminance, and a normal element away from a malfunctioning element has high luminance, or such that a normal element close to a malfunctioning element has high luminance, and a normal element away from a malfunctioning element has low luminance.

Figure 24:
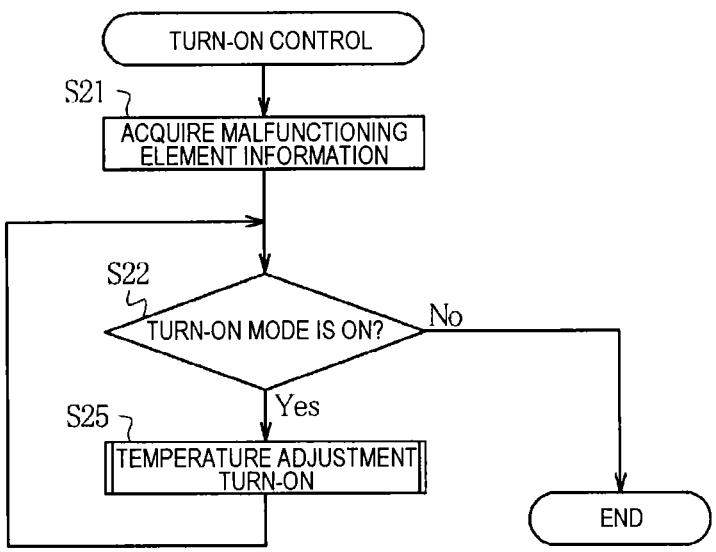
FIG. 24 is a flowchart showing another modification of the turn-on control routine in the method of controlling an illumination apparatus.

Instead of the luminance adjustment turn-on routine, as another modification of the turn-on control, temperature adjustment turn-on based on a turn-on control routine in a flowchart of FIG. 24 may be performed for each emission area. In the flowchart of FIG. 24, the luminance adjustment turn-on routine of Step S24 in the flowchart of FIG. 21 is replaced with a temperature adjustment turn-on routine of Step S25. Step S25 will be specifically described below from a flowchart of a temperature adjustment turn-on routine shown in FIG. 25.

In Step S251, positional information of the malfunctioning organic EL elements 4 is acquired from the malfunctioning element information read in Step S21 to obtain the state of distribution of the malfunctioning organic EL elements 4, the amount of current supply for each emission color is calculated based on an increase in temperature of each organic EL element 4 obtained from the amount of heat generation calculated using the product of the voltage and current applied to the organic EL element 4 and luminance efficiency parameters such that the surface temperature of each organic EL element 4 is substantially uniform, and an instruction is sent from the processor 10 to the constant current source circuits CA1 to CAm. Here, control is performed such that a variation in temperature in the area of a ⅕ angle of the minor axis of the organic EL element is within 10° C.

In Step S252, each of the constant current source circuits CA1 to CAm adjusts the current value to be supplied to each of the normal organic EL elements 4 from the amount of current supply obtained in Step S251, and the temperature adjustment turn-on routine ends. Each time the temperature adjustment turn-on routine is repeatedly executed, the surface temperature of the light-emitting surface 7 may be changed at a predetermined time interval. Accordingly, it is possible to reduce a deviation in heat generation to suppress a non-conduction malfunction, thereby extending the element lifetime.

In this way, according to this example, the malfunction detection is performed for all of the organic EL elements 4 constituting the illumination apparatus 1, and the turn-on control of the light-emitting surface 7 is performed using the normal organic EL elements 4 based on the state of distribution of the malfunctioning organic EL element 4 detected through the malfunction detection. If the malfunction detection and the turn-on control are executed, it is possible to accurately detect the malfunctioning organic EL elements 4 and to make a turn-off state due to a malfunction less noticeable.

Before the malfunction detection of the organic EL elements 4, the reference voltage range map, the temperature compensation factor map, and the time-dependent compensation factor map including compensation for the integrated time of the turn-on time and compensation for initial variation is registered in the memory 26 in advance, thereby reducing the calculation load of the processor 10 to quickly correct the reference voltage range.

(Modification of Malfunction Detection)

Figure 26:
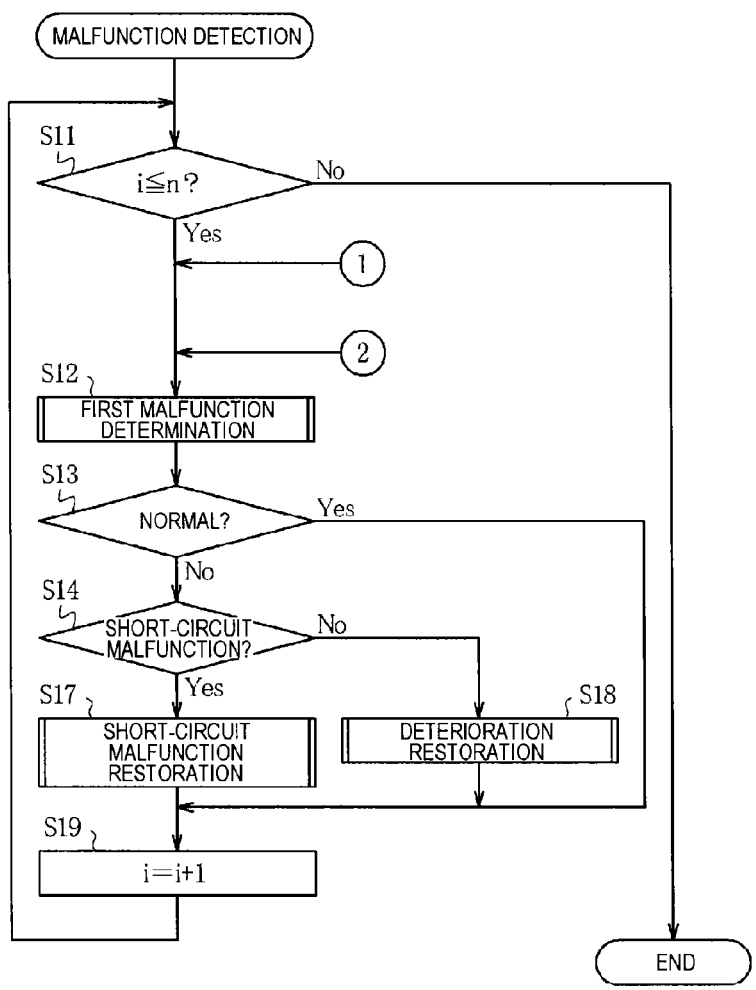
FIG. 26 is a flowchart showing a modification of the malfunction detection routine of the first example shown in FIG. 7.

A modification of the first example will be described below. In this modification, the second malfunction determination routine of Step S15 in the malfunction detection routine is removed. FIG. 26 is a flowchart of a modification of the malfunction detection routine.

As shown in FIG. 26, in the first malfunction determination routine of Step S12, the organic EL element 4 as a subject for detection is driven to be turned on and malfunction determination is performed. When a malfunction is detected, in Step S14, it is determined whether the malfunction is a short-circuit malfunction or a non-conduction malfunction. In the case of a short-circuit malfunction, the short-circuited area of the corresponding organic EL element 4 is restored through the short-circuit malfunction restoration routine of Step S17. In order to determine whether or not the short-circuited area is restored after the short-circuited area of the organic EL element 4 is restored in Step S17, the short-circuit malfunction restoration routine of Step S17 is performed, and the process then returns to Step S12.

In this way, the organic EL element 4 is driven to be driven and the malfunction determination is performed by the same driving method as when it is determined to be a malfunction after the short-circuited area is restored, thereby more reliably determining whether or not a short-circuit malfunction area is restored.

Figure 27:
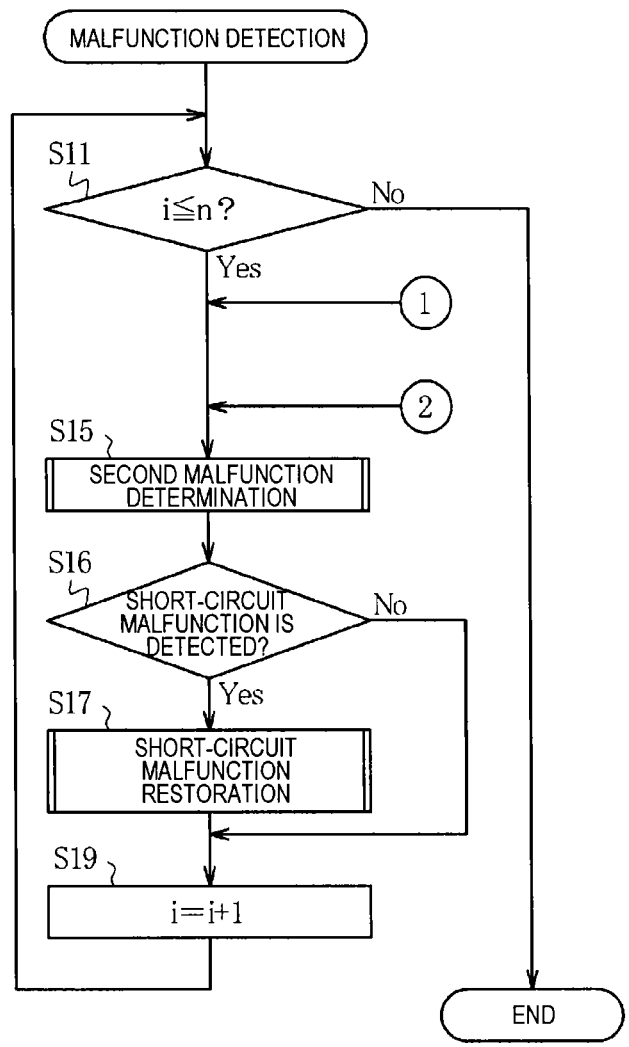
FIG. 27 is a flowchart showing another modification of the malfunction detection routine of the first example shown in FIG. 7.

Another modification of the first example will be described. In this modification, in the malfunction detection routine, the first malfunction determination routine of Step S12 is removed. FIG. 27 is a flowchart of another modification of the malfunction detection routine. In this modification, since only the second malfunction determination is executed, as described below, when it is determined to be not a short-circuit malfunction, it is assumed that it is determined to be a non-conduction malfunction.

As shown in FIG. 27, in the second malfunction determination routine of Step S15, the organic EL element 4 as a subject for detection is driven to be turned off and the malfunction determination is performed. When a short-circuit malfunction is detected in Step S16, in Step S17, the short-circuited area is restored. In order to determine whether or not the short-circuited area is restored, the process returns to Step S15. When a short-circuit malfunction is not detected in Step S16, it is determined to be normal, and the process progresses to Step S19. In this way, if the short-circuited area restoration determination is performed, the same effects as the foregoing modification can be obtained.

(Modification of Turn-On Control)

As still another modification of the turn-on control, at least two of pattern turn-on, luminance adjustment turn-on, and temperature adjustment turn-on may be performed at a predetermined time interval in combination. Accordingly, deviation in the heat generation of the normal organic EL elements 4 is reduced and a non-conduction malfunction is suppressed, thereby extending the element lifetime.

Second Example

Next, a method of controlling an illumination apparatus according to a second example will be described below. The method of controlling an illumination apparatus according to this example is different from the first example in that communication means is provided in the illumination apparatus 1, and other parts are common. Thus, description of the common parts will not be repeated, and the difference will be described.

(Network Configuration of Illumination Apparatus)

Figure 28:
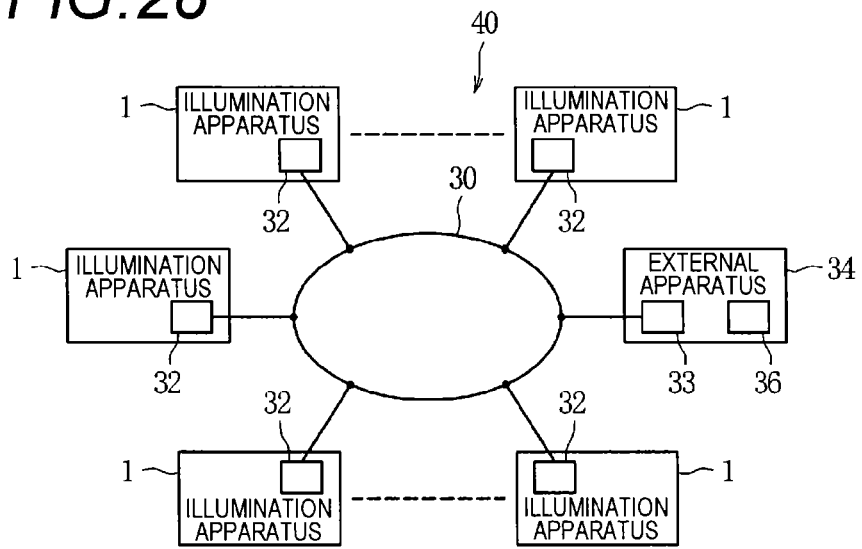
FIG. 28 is a configuration diagram schematically showing a network including an illumination apparatus according to the second example of the invention.

FIG. 28 shows the network configuration of an illumination apparatus including an external apparatus according to the second example of the invention. The illumination apparatus 1 has an interface (communication means) 32, and a plurality of illumination apparatuses 1 are connected to a network 30 through the interfaces 32. An external apparatus 34 is connected to the network 30 through an interface 33 to constitute a large-scale illumination system 40. The external apparatus 34 has a memory 36, a processor (not shown), and the like, and performs communication with each illumination apparatus 1 or control through the network 30. The external apparatus 34 may be constituted a system controller, a personal computer, or the like. The network 30 is a LAN, a WAN, a MAN, or the like. As in the first example, the illumination apparatus 1 has a configuration as shown in FIG. 4.

Each illumination apparatus 1 constituting the illumination system 40 holds identification information for identifying the illumination apparatus 1. The external apparatus 34 identifies each illumination apparatus 1 using the identification information, and performs data read/write and turn-on control.

(Control of Illumination Apparatus By External Apparatus)

The control of the illumination apparatus 1 configured as above will be described below. The malfunction detection routine described in the first example is performed separately by each illumination apparatus 1, and the detection result is transmitted to the external apparatus 34 through the network 30. The external apparatus 34 registers the transmitted detection result in the memory 36, and performs turn-on control in accordance with the detection result of each illumination apparatus 1. Though not shown, data of the illumination apparatus 1 read by the external apparatus 34 may be output to the output device (for example, a monitor, a printer, or the like) of the external apparatus 34. The external apparatus 34 registers data necessary for malfunction detection in each illumination apparatus 1 in the memory 36, and writes data necessary for the malfunction detection into the memory 26 of each illumination apparatus 1.

Examples of readable and writable data from among data registered in the memory 26 by the external apparatus 34 include the reference voltage range map, the temperature compensation factor map for correcting the reference voltage range, the time-dependent compensation factor map including compensation for the integrated time of the turn-on time and compensation for variation in voltage in the initial turn-on, and the like. There are also the heat generation parameters of the organic EL elements 4, characteristic balance data of each emission color, the maximum current value, the visibility correction map for emission luminance, and the like. There are also various set values for control, for example, the magnitude of the applied voltage of the reverse voltage pulse, the magnitude of the overvoltage pulse, the magnitude of the overcurrent pulse, the prescribed number of times Psmax and Pdmax for defining the number of applications of the pulse, and the like. The malfunctioning element information of the organic EL elements 4 registered in Steps S175 and S185, and the programs constituting the malfunction detection routine of Step S1 and the turn-on control routine of Step S2 of the method of controlling the illumination apparatus 1 are readable and writable.

(Turn-On Control of Illumination Apparatus)

The external apparatus 34 performs turn-on control of an arbitrary illumination apparatus 1 connected to the network 30 or a plurality of illumination apparatuses 1. In regard to the turn-on control, only the turn-on control routine of Step S2 of the first example shown in FIG. 6 is executed.

Specifically, the external apparatus 34 performs the pattern turn-on routine of Step S23 shown in FIG. 18, the luminance adjustment turn-on routine of Step S24 shown in FIG. 21, or the temperature adjustment turn-on routine of Step S25 shown in FIG. 24 for each illumination apparatus 1 connected to the network 30 to perform the turn-on control of each organic EL element 4. As described in other modification of the first example, the pattern turn-on routine of Step S23, the luminance adjustment turn-on routine of Step S24, and the temperature adjustment turn-on routine of Step S25 may be combined to perform the turn-on control.

The pattern turn-on of Step S23 will be described with reference to FIGS. 18 and 20 as in the first example. The description of the steps common to the first example will not be repeated.

In Step S21, the external apparatus 34 acquires the malfunctioning element information registered in the memory 26 of each illumination apparatus 1 through the network 30.

In Step S231, the external apparatus 34 obtains the state of distribution of the malfunctioning elements in each illumination apparatus 1 from the malfunctioning element information of each illumination apparatus 1 acquired in Step S21, and obtains the turn-on pattern of the illumination system 40.

The turn-on pattern obtained in Step S231 is the turn-on pattern which is regular as the whole of the illumination system 40.

In Step S232, the external apparatus 34 transmits the turn-on pattern obtained in Step S231 to each illumination apparatus 1 through the network 30. The processor 10 of each illumination apparatus 1 switches the ON/OFF of each organic EL element 4 of each emission area based on the turn-on pattern transmitted from the external apparatus 34 to form the turn-on pattern. The regular turn-on pattern obtained in Step S231 is formed as the illumination system 40. Accordingly, a uniform turn-on pattern is formed as the whole of the illumination system 40, thereby improving the appearance as a decorative illumination and securing appropriate illumination light. Since a deviation in the heat generation of the normal organic EL elements 4 is reduced, thereby extending the element lifetime of the normal organic EL elements 4.

Figure 22:
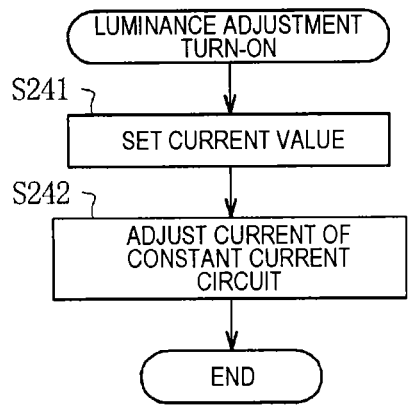
FIG. 22 is a flowchart showing a luminance adjustment turn-on routine which is a modification of a turn-on control routine.

Next, as a modification of the turn-on control, the luminance adjustment turn-on of Step S24 will be described with reference to FIGS. 21 and 22 as in the first example. The description of the steps common to the first example will not be repeated.

In Step S21, the external apparatus 34 acquires the malfunctioning element information registered in the memory 26 of each illumination apparatus 1 through the network 30.

In Step S241, the external apparatus 34 obtains the state of distribution of the malfunctioning elements in each illumination apparatus 1 from the malfunctioning element information of each illumination apparatus 1 acquired in Step S21, and obtains the amount of change in the current to be supplied to each organic EL element 4 constituting each illumination apparatus 1 using the current-luminance characteristic map corresponding to each illumination apparatus 1 or the visibility correction map for emission luminance such that the luminance of the entire illumination system 40 is averaged. The way to obtain the amount of change in the current using the current-luminance characteristic map or the visibility correction map for emission luminance is the same as the contents described in the first example.

In Step S242, the external apparatus 34 transmits the current value obtained in Step S241 to each illumination apparatus 1 through the network 30. The processor 10 of each illumination apparatus 1 adjusts the current value to be supplied to each organic EL element 4 of each emission area based on the current value transmitted from the external apparatus 34. While color irregularity occurs as the illumination system 40, an illumination in which luminance is substantially averaged is obtained. Therefore, it is possible to secure appropriate uniform illumination light as the whole of the illumination system 40.

Figure 25:
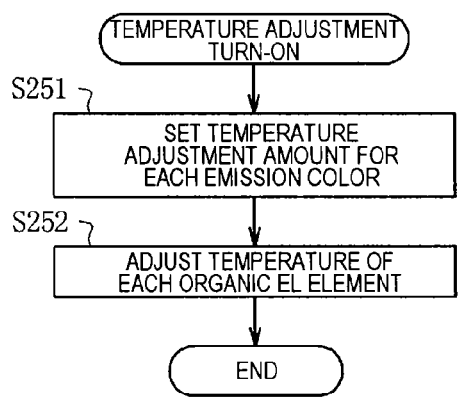
FIG. 25 is a flowchart showing a temperature adjustment turn-on routine as another modification of the turn-on control routine.

The temperature adjustment turn-on described as another modification of the turn-on control will be described below with reference to FIGS. 24 and 25. The description of the steps common to the first example will not be repeated.

In Step S21, the external apparatus 34 acquires the malfunctioning element information registered in the memory 26 of each illumination apparatus 1 through the network 30.

In Step S251, the external apparatus 34 obtains the state of distribution of the malfunctioning elements in each illumination apparatus 1 from the malfunctioning element information of each illumination apparatus 1 acquired in Step S21, and calculates the amount of current supply for each emission color based on the electrical characteristic and the heat generation characteristics of the organic EL element 4 from the obtained state of distribution such that the surface temperature of each organic EL element 4 is substantially uniform.

In Step S252, the external apparatus 34 transmits the amount of current supply obtained in Step S251 to each illumination apparatus 1. The processor 10 of each illumination apparatus 1 sends an instruction to the constant current source circuits CA1 to CAm so as to become the amount of current supply for each emission color transmitted from the external apparatus 34, and the temperature of the organic EL elements 4 is adjusted by the constant current source circuits CA1 to CAm. Accordingly, while luminance irregularity occurs as the illumination system 40, since the surface temperature of each illumination apparatus 1 is substantially uniform, it is possible to secure appropriate illumination light as the illumination system 40.

With the turn-on control, it is possible to make the turn-off state of the malfunctioning organic EL element 4 less noticeable, thereby improving the quality of the illumination apparatus 1.

In this way, according to this example, a single illumination apparatus 1 having the interface 32 or a plurality of illumination apparatuses 1 and the external apparatus 34 are connected to the network 30, and read and write of data registered in the memory 26 of the illumination apparatus 1 or the turn-on control of the illumination apparatus 1 is performed from the external apparatus 34, thereby easily performing the management of data registered in the memory 26 of the illumination apparatus 1 and easily performing the management or operation of the illumination apparatus 1.

If the program stored in the memory 26 is rewritten from the external apparatus 34, it is possible to collectively improve malfunction detection and turn-on control and to add functions, thereby improving expandability in malfunction detection or turn-on control of the illumination apparatus 1.

The large-scale illumination system 40 is constituted, and the external apparatus 34 performs read and write of data registered in the memory 26 of each illumination apparatus 1 or turn-on control of each illumination apparatus 1, thereby constructing a large-scale illumination system.

When there is a malfunctioning organic EL element 4, the turn-on control of each illumination apparatus 1 is performed from the external apparatus 34, such that illumination light of all of the illumination apparatuses 1 is appropriately controlled in accordance with the malfunction condition of each illumination apparatus 1. For this reason, uniform illumination light is obtained as the whole of the illumination system 40, thereby maintaining the quality of illumination light.

Since each illumination apparatus 1 can be managed by the external apparatus 34 in a centralized manner, it is possible to easily perform the management of each illumination apparatus 1.

(Modification of Network Configuration of Illumination Apparatus)

Figure 29:
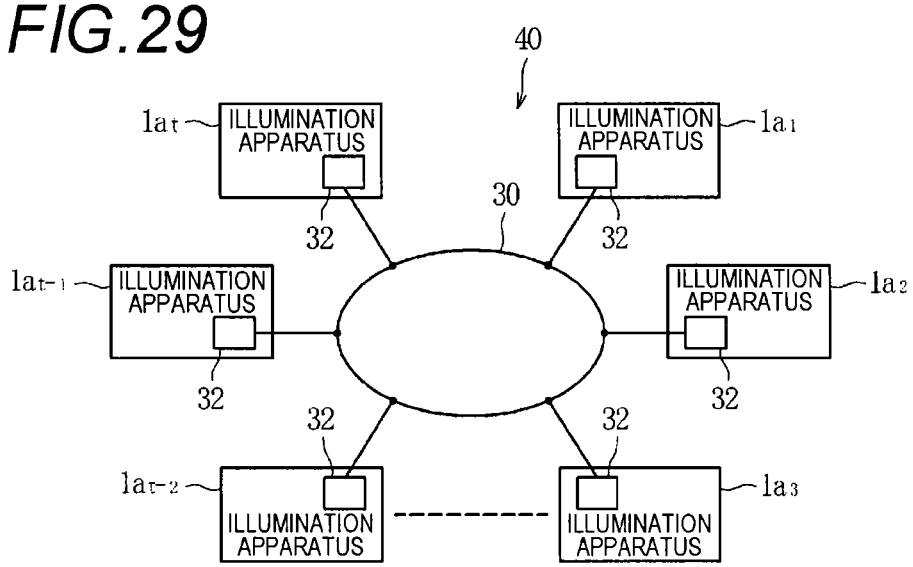
FIG. 29 is a configuration diagram schematically showing a network as a modification of the second example.

A modification of the network configuration of the second example will be described below. In this modification, the illumination system 40 has only the illumination apparatuses 1. FIG. 29 is a network configuration diagram.

As shown in FIG. 29, each illumination apparatus 1 is connected to the network 30 through the interface 32 to constitute a large-scale illumination system 40. Illumination apparatuses $1a_1$ to $1a_t$ configured as above can perform communication through the network 30. Data which is readable and writable through communication in each illumination apparatus 1 is the same as in the second example.

As an example, the malfunctioning element information registered in the memory 26 of each illumination apparatus 1, surface temperature information of emission areas constituting each illumination apparatus 1, luminance information of each organic EL element 4, emission color information of the organic EL light-emitting panel 2, output information to the power supply circuit 14 of each illumination apparatus 1, and the like are acquired through communication. Accordingly, it becomes possible to perform the turn-on control of the illumination apparatus 1 in accordance with malfunction information of each surrounding illumination apparatus 1 arranged around and to perform the turn-on control of the entire illumination system 40.

In the illumination system 40 configured as above, for example, if the illumination apparatus $1a_1$ is regarded as a main illumination apparatus (hereinafter, referred to as a master illumination apparatus), and each of other illumination apparatuses $1a_2$ to $1a_t$ is regarded as a secondary illumination apparatus (hereinafter, referred to as a slave illumination apparatus), the master illumination apparatus $1a_1$ has the same function as the external apparatus 34 to perform data read/write and turn-on control of the slave illumination apparatuses $1a_2$ to $1a_t$. Accordingly, since the slave illumination apparatuses $1a_2$ to $1a_t$ can be controlled by the master illumination apparatus $1a_1$ in a centralized manner, it is possible to easily perform the management of the illumination apparatuses $1a_1$ to $1a_t$.

Third Example

Next, a method of controlling an illumination apparatus according to a third example will be described below. In the method of controlling an illumination apparatus according to this example has the same configuration as in the second example in that communication means is provided in the illumination apparatus 1. In this example, control of an illumination apparatus when the replacement time of the illumination apparatus 1 is notified using the communication means will be described below.

(Network Configuration of Illumination Apparatus)

As described in the second example, the network configuration of illumination apparatuses of this example is as shown in FIG. 28, a single or a plurality of illumination apparatuses 1 and the external apparatus 34 are connected to the same network 30 to constitute the illumination system 40.

(Control of Illumination Apparatus of External Apparatus)

The control of the illumination apparatus 1 by the external apparatus 34 in this example will be described. In the control of the illumination apparatus 1 of this example, as in the second example, the external apparatus 34 performs communication with each illumination apparatus 1 and performs read/write of data and programs registered in the memory 26 of each illumination apparatus 1 and the turn-on control of each illumination apparatus 1. Readable and writable data is the same as in the second example. As in the first example, the configuration of each illumination apparatus 1 is as shown in FIG. 4. The malfunction detection is performed by each illumination apparatus 1 as in the second example.

(Turn-On Control of Illumination Apparatus)

Figure 30:
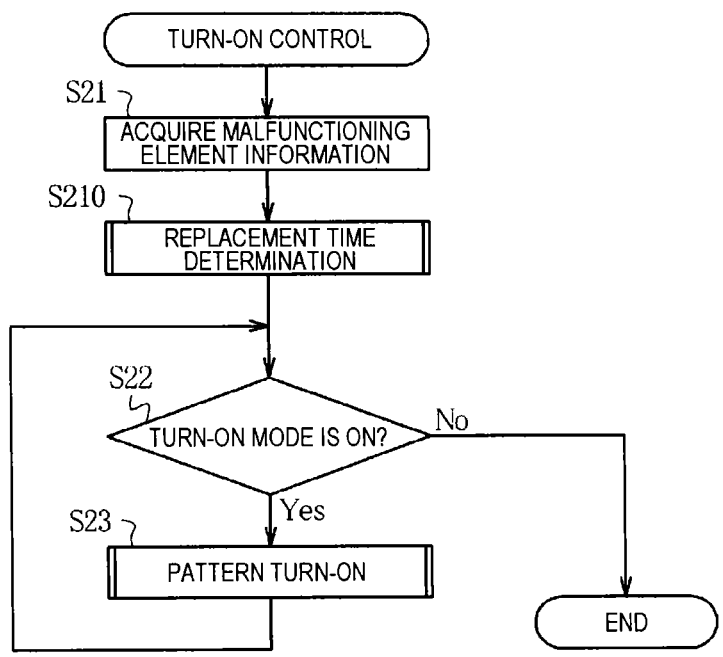
FIG. 30 is a flowchart showing a turn-on control routine in a method of controlling an illumination apparatus according to a third example of the invention.

In regard to the turn-on control of the illumination apparatus in this example, as in the second example, a turn-on control routine shown in FIG. 30 is performed by the external apparatus 34 in an overall manner; however, there is a difference in that the replacement time of each illumination apparatus 1 is determined through the turn-on control routine. FIG. 30 shows turn-on control which is performed by the external apparatus 34 for each illumination apparatus 1, and when a plurality of illumination apparatuses 1 are arranged, the turn-on control is performed for each illumination apparatus 1. Specifically, description will be provided from a flowchart of a turn-on control routine shown in FIG. 30.

In Step S21, the external apparatus 34 acquires the malfunctioning element information registered in the memory 26 of each illumination apparatus 1 through the network 30.

Figure 31:
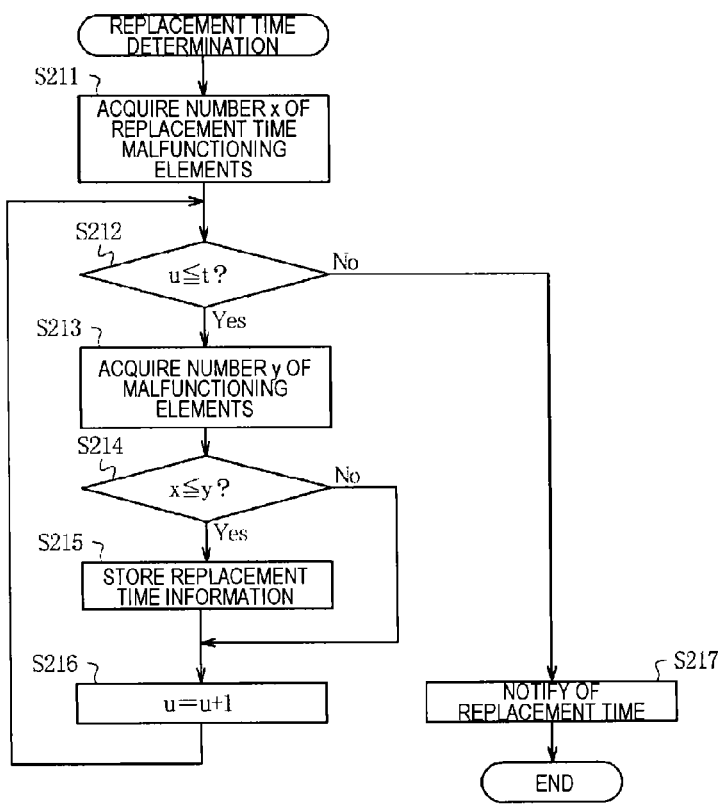
FIG. 31 is a flowchart showing a replacement time determination routine which is performed in the turn-on control routine shown in FIG. 30.

In Step S210, the external apparatus 34 obtains the state of distribution of the malfunctioning organic EL elements 4 from the malfunctioning element information acquired in Step S21, and determines the replacement time of each illumination apparatus 1 from the obtained state of distribution. Specifically, description will be provided from a flowchart of a replacement time determination routine shown in FIG. 31.

In Step S211, the external apparatus 34 acquires the number (a predetermined number of) x of malfunctioning elements as an indication of the replacement time of the illumination apparatus 1 registered in the memory 36 of the external apparatus 34 in advance. It is preferable that the number x of malfunctioning elements is, for example, equal to or greater than 0.5% and equal to or smaller than 25% of the number of organic EL elements 4 arranged in the illumination apparatus 1. More preferably, the number of malfunctioning elements is equal to or greater than 5% and equal to or smaller than 20% of the number of organic EL elements 4.

In Step S212, it is determined whether or not the number u of illumination apparatuses in which the replacement time is determined is equal to or smaller than the total number t of illumination apparatuses 1 constituting the illumination system 40. When the determination result is true (Yes), since the replacement time determination for all of the illumination apparatuses 1 does not end, the process progresses to Step S213. When the determination result is false (No), it is determined that the replacement time determination for all of the illumination apparatus ends, the process progresses to Step S217.

In Step S213, the external apparatus 34 obtains the state of distribution of the malfunctioning organic EL elements 4 in the u-th illumination apparatus 1 from among the malfunctioning element information of each illumination apparatus 1 acquired in Step S21, and acquires the number y of malfunctioning elements of the malfunctioning organic EL element 4.

In Step S214, it is determined whether or not the number y of malfunctioning elements of the u-th illumination apparatus 1 acquired in Step S213 is equal to or greater than the number x of malfunctioning elements as an indication of the replacement time acquired in Step S211. When the determination result is true (Yes), it is determined to be the replacement time of the illumination apparatus 1, and the process progresses to Step S214. When the determination result is false (No), it is determined to be not the replacement time, and the replacement time determination routine ends.

In Step S215, information representing the replacement time of the u-th illumination apparatus 1 is stored in the memory 36 or the like of the external apparatus 34 based on the determination in Step S214 to be the replacement time of the illumination apparatus 1, and the process progresses to Step S216. Subsequently, in Step S216, the number u of illumination apparatuses increments.

In Step S217, the external apparatus 34 outputs the illumination apparatus 1, which is determined that replacement is required, stored in the memory 36 or the like to the external output device, such as a monitor or a printer (not shown), ends the replacement time determination routine, and progresses to Step S22. Examples of data to be notified may include identification information for identifying the illumination apparatus 1, a flag representing the replacement time, and the like. At the time of output to the output device, the effect of the replacement time may be output along with the identification information of the illumination apparatus 1.

The processing after Step S22 is the same as in the first example, and description thereof will not be repeated.

In this way, according to this example, in the method of controlling an illumination apparatus, the illumination apparatuses 1 are managed by the external apparatus 34 in a centralized manner, and the replacement time of each illumination apparatus 1 is automatically notified to the external apparatus 34. Accordingly, it is possible to accurately recognize the replacement time of the illumination apparatus 1, thereby easily performing the management of the illumination apparatus 1.

As a modification of the replacement time determination of the illumination apparatus 1, an application may be made to the illumination system 40 having the master illumination apparatus $1a_1$ and a plurality of slave illumination apparatuses $1a_2$ to $1a_t$ as the modification of the second example shown in FIG. 29 as described above. The master illumination apparatus $1a_1$ may determine the replacement time of each illumination apparatus 1 by executing the replacement time determination routine of Step S210 relating to the need for replacement of the master illumination apparatus $1a_1$ and a plurality of slave illumination apparatuses $1a_2$ to $1a_t$.

Although the embodiment has been described, the invention is not limited to the foregoing embodiment.

For example, although in the foregoing example and modifications, the illumination apparatus 1 has the single organic EL light-emitting panel 2, the invention is not limited thereto, and the illumination apparatus 1 may have a plurality of organic EL light-emitting panels 2. Accordingly, although in the foregoing third example, the replacement time of the illumination apparatus 1 is determined, the invention is not limited, and when the illumination apparatus 1 has a plurality of organic EL light-emitting panels 2, the replacement time determination routine may be executed for each organic EL light-emitting panel 2, and the organic EL light-emitting panel 2 which is determined to be the replacement time may be output to the external output device or the like.

Although in the foregoing examples and modifications, the reference voltage ranges Vmin to Vmax are corrected from the temperature compensation factor map or the time-dependent compensation factor map, the invention is not limited thereto, and the reference voltage ranges may be corrected using a characteristic map selected from at least one of the temperature compensation factor map and the time-dependent compensation factor map.

Although in the foregoing examples and modifications, a case has been described where the pattern turn-on routine executed in the turn-on control routine, and as a modification, the luminance adjustment turn-on routine and the temperature adjustment turn-on routine are performed, the pattern turn-on routine, the luminance adjustment turn-on routine, and the temperature adjustment turn-on routine may be switched at a predetermined time interval, or various combinations may be made. That is, as an example, the luminance adjustment turn-on routine may be performed while the pattern turn-on routine is performed. Accordingly, deviations in the heat generation and surface temperature of the light-emitting surface 7 are reduced to suppress a non-conduction malfunction of each organic EL element 4, making it possible to extend the element lifetime of normal organic EL elements 4.

In the turn-on control routine, at least one of the pattern turn-on routine, the luminance adjustment turn-on routine, and the temperature adjustment turn-on routine may be selected to perform the turn-on control.

Although in the foregoing examples, in the luminance adjustment turn-on routine, the luminance of each of the normal organic EL elements 4 with the same emission color as the malfunctioning organic EL element 4 around the malfunctioning organic EL element 4 in the predetermined area increases, and the luminance of each of the normal organic EL elements 4 with an emission color different from the malfunctioning organic EL element 4 decreases, luminance adjustment is not limited thereto. For example, at least one of an operation to increase the luminance of each of the normal organic EL elements 4 in the predetermined area including the malfunctioning organic EL element 4 and an operation to decrease the luminance of each of the normal organic EL elements 4 in the predetermined area including the malfunctioning organic EL element 4 may be performed. Accordingly, while color irregularity occurs in the light-emitting surface 7, it is possible to make the malfunctioning organic EL element 4 less noticeable.

Although the invention has been described in detail or with reference to specific embodiments, it is obvious to those skilled in the art that various alterations or corrections may be made without departing from the spirit and scope of the invention.

According to the method of controlling an illumination apparatus of the invention, a malfunction of an organic EL element is detected based on the electrical characteristics of the organic EL element, and the turn-on state of the light-emitting surface of the illumination apparatus is controlled based on the state of distribution of malfunctioning elements, thereby accurately detecting a malfunction of an organic EL element and improving the quality of the illumination apparatus by making the malfunction of the organic EL element less noticeable.

What is claimed is:

1. A method of controlling an illumination apparatus in which a light-emitting surface is formed by a single light-emitting panel or a plurality of light-emitting panels having a plurality of organic electroluminescence elements with different emission colors arranged in a stripe shape, the method comprising:

a malfunction detection step of detecting a malfunction of each of the organic electroluminescence elements based on an electrical characteristic of the organic electroluminescence element;

a short-circuit malfunction restoration step of performing short-circuit malfunction restoration processing on an element which is determined to be a short-circuit malfunction in the malfunction detection step;

a short-circuit malfunction restoration determination step of determining whether or not the element which is determined to be the short-circuit malfunction is restored after the short-circuit malfunction restoration step;

a malfunctioning element determination step of, when it is determined in the short-circuit malfunction restoration determination step that the element which is determined to be the short-circuit malfunction is not restored, repeating the short-circuit malfunction restoration step and the short-circuit malfunction restoration determination step, and when the number of determinations that the element which is determined to be the short-circuit malfunction is not restored exceeds a predetermined number of times, storing individual information including identification information of the element as a malfunctioning element in a storage; and a turn-on control step of controlling a turn-on state of the light-emitting surface based on a state of distribution of malfunctioning elements whose individual information is stored in the malfunctioning element determination step.

2. The method of controlling the illumination apparatus according to claim 1, wherein
the malfunction detection step includes:
a driving step of driving the organic electroluminescence element;
a measurement step of measuring the electrical characteristic of the organic electroluminescence element in a driving state where the organic electroluminescence element is driven;
a reference range setting step of setting a reference range for the electrical characteristic measured in the measurement step; and
a malfunction determination step of determining to be a malfunction of the organic electroluminescence element when the electrical characteristic measured in the measurement step is outside the reference range set in the reference range setting step.

3. The method of controlling the illumination apparatus according to claim 2, wherein
the driving step includes a turn-on driving step in which the organic electroluminescence element is driven in a turn-on state, and
the malfunction determination step includes a first malfunction determination step of, when an element is driven in the turn-on driving step, determining to be a non-conduction malfunction if a voltage value measured as the electrical characteristic in the measurement step is greater than a predetermined reference voltage range serving as the reference range, and determining to be a short-circuit malfunction if the measured voltage value is smaller than the predetermined reference voltage range.

4. The method of controlling the illumination apparatus according to claim 2, wherein
the driving step includes a turn-off state driving step in which the organic electroluminescence element is driven in a turn-off state, and
the malfunction determination step may include includes a second malfunction determination step of, when an element is driven in the turn-off driving step, determining to be a short-circuit malfunction when the electrical characteristic measured in the measurement step is outside the reference range.

5. The method of controlling the illumination apparatus according to claim 4, wherein
in the turn-off driving step, a current which is supplied to the electroluminescence element is equal to or greater than 1.0 and equal to or smaller than 1.8 times a standard current flowing when a voltage at a built-in potential obtained by $(\phi p-\phi n)/e$ is applied, where $\phi p$ indicates a work function of an electrode material of a positive electrode, $\phi n$ indicates a work function of an electrode material of a negative electrode, and e indicates the elementary charge, the positive electrode and the negative electrode constituting the organic electroluminescence element.

6. The method of controlling the illumination apparatus according to claim 4, wherein
in the turn-off driving step, a voltage which is applied to the organic electroluminescence elements is a voltage in a reverse voltage direction.

7. The method of controlling the illumination apparatus according to claim 2, wherein
the driving step of driving the organic electroluminescence element before the measurement step, wherein
the driving step includes:
a turn-on driving step in which the organic electroluminescence element is driven in a driving state to be turned on; and
a turn-off driving step in which the organic electroluminescence element is driven in a driving state to be turned off,
the malfunction determination step includes:
a first malfunction determination step of, when an element is driven in the turn-on driving step, determining to be a non-conduction malfunction if a voltage value measured as the electrical characteristic in the measurement step is greater than a predetermined reference voltage range serving as the reference range, and determining to be a short-circuit malfunction if the measured voltage value is smaller than the predetermined reference voltage range; and
a second malfunction determination step of, when an element is driven in the turn-off driving step, determining to be a short-circuit malfunction if the electrical characteristic measured in the measurement step is outside the reference range, and
the second malfunction determination step is performed after it is determined to be a short-circuit malfunction in the first malfunction determination step.

8. The method of controlling the illumination apparatus according to claim 1, wherein
the predetermined number of times is equal to or greater than two and equal to or smaller than ten.

9. The method of controlling the illumination apparatus according to claim 1, wherein
in the turn-on control step, distribution information of malfunctioning elements whose individual information is stored in the malfunctioning element determination step is obtained, and the turn-on state of each of normal organic electroluminescence elements other than the malfunctioning elements is controlled based on the distribution information such that an emission pattern in the light-emitting surface becomes regular.

10. The method of controlling the illumination apparatus according to claim 1, wherein
in the turn-on control step, power feed to the malfunctioning element is stopped.

11. The method of controlling the illumination apparatus according to claim 1, wherein
in the turn-on control step, luminance adjustment is performed so as to adjust the luminance of each of the normal organic electroluminescence elements other than the malfunctioning elements such that luminance in the light-emitting surface is substantially uniform.

12. The method of controlling the illumination apparatus according to claim 11, wherein
the luminance adjustment increases the luminance of each of the normal organic electroluminescence elements with the same color as the emission color of the malfunctioning element in a predetermined area including the malfunctioning element and decreases the luminance of each of the normal organic electroluminescence elements with a color different from the emission color of the malfunctioning element in the predetermined area.

13. The method of controlling the illumination apparatus according to claim 1, wherein
in the turn-on control step, the surface temperature of each of the normal organic electroluminescence elements other than the malfunctioning element is adjusted such that the surface temperature of the light-emitting surface is substantially uniform.

14. The method of controlling the illumination apparatus according to claim 1, wherein
in the turn-on control step, distribution information of malfunctioning elements whose individual information is stored in the malfunctioning element determination step is obtained, and at least two of turn-on state control for controlling the turn-on state of each of the normal organic electroluminescence elements other than the malfunctioning element based on the distribution information such that an emission pattern in the light-emitting surface becomes regular, power feed stop control for stopping power feed to the malfunctioning element, luminance adjustment for adjusting the luminance of each of the normal organic electroluminescence elements other than the malfunctioning element such that luminance in the light-emitting surface is substantially uniform, and temperature adjustment for adjusting the surface temperature of each of the normal organic electroluminescence elements other than the malfunctioning element such that the surface temperature of the light-emitting surface is substantially uniform is performed in combination.

15. The method of controlling the illumination apparatus according to claim 14, wherein
the turn-on control step performs at least one of the turn-on state control, the power feed stop control, the luminance adjustment, and the temperature adjustment at a predetermined time interval.

16. The method of controlling the illumination apparatus according to claim 1, wherein
turn-on control information is registered in the storage in advance before the turn-on control step,
the turn-on control information includes at least one of:
a current-luminance characteristic map of the organic electroluminescence elements;
the heat generation parameters of the organic electroluminescence elements;
characteristic balance data of the respective colors of the organic electroluminescence elements;
the maximum current value of the organic electroluminescence elements; and
a visibility correction map for the emission luminance of the organic electroluminescence elements, and
the turn-on control step is performed based on the turn-on control information.

17. The method of controlling the illumination apparatus according to claim 1, wherein
the illumination apparatus includes a communication unit, and
the method further includes a communication step of connecting the communication unit to a communication unit of an external apparatus to communicate with the communication unit of the external apparatus.

18. The method of controlling the illumination apparatus according to claim 17, wherein
the external apparatus is a system controller.

19. The method of controlling the illumination apparatus according to claim 17, wherein
the external apparatus is another illumination apparatus different from the illumination apparatus.

20. The method of controlling the illumination apparatus according to claim 17, wherein
the communication step further includes a replacement time notification step of giving notification of the replacement time of the corresponding light-emitting panel from the individual information stored as a malfunctioning element in the storage.

* * * * *